(12) United States Patent
Sharrah et al.

(10) Patent No.: US 7,614,760 B2
(45) Date of Patent: Nov. 10, 2009

(54) MOUNTABLE LIGHT PROVIDING ILLUMINATION AND OPTIONALLY AIMING

(75) Inventors: Raymond L. Sharrah, Collegeville, PA (US); John C. DiNenna, Norristown, PA (US); C. Bradford Penney, Upper Providence Township, PA (US)

(73) Assignee: Streamlight, Inc., Eagleville, PA (US)

( * ) Notice: Subject to any disclaimer, the term of this patent is extended or adjusted under 35 U.S.C. 154(b) by 0 days.

(21) Appl. No.: 11/710,791

(22) Filed: Feb. 26, 2007

(65) Prior Publication Data
US 2007/0147042 A1 Jun. 28, 2007

Related U.S. Application Data

(62) Division of application No. 11/268,787, filed on Nov. 8, 2005, now Pat. No. 7,188,978.

(60) Provisional application No. 60/627,860, filed on Nov. 15, 2004.

(51) Int. Cl.
F41G 1/34 (2006.01)
(52) U.S. Cl. .................. 362/111; 362/205; 362/114
(58) Field of Classification Search ......... 362/110–114, 362/157, 205, 228, 259; 439/488–490
See application file for complete search history.

(56) References Cited

U.S. PATENT DOCUMENTS

| | | | |
|---|---|---|---|
| 2,597,565 A | 5/1952 | Chandler et al. | |
| 2,601,613 A | 6/1952 | Jahncke | |
| 3,153,856 A | 10/1964 | Felix | |
| 3,488,488 A | 1/1970 | Crouch | |
| 3,513,581 A | 5/1970 | Slater | |
| 3,877,166 A | 4/1975 | Ward | |
| 4,580,362 A | 4/1986 | Stevens | |
| 4,697,226 A | 9/1987 | Verdin | |
| 4,856,218 A | 8/1989 | Reynolds, Jr. | |
| 5,180,220 A | 1/1993 | Van Kalsbeek | |
| 5,400,540 A | 3/1995 | Solsinsky et al. | |
| 5,430,967 A | 7/1995 | Woodman, III et al. | |
| 5,522,167 A * | 6/1996 | Teetzel .................. 42/117 |
| 5,584,137 A | 12/1996 | Teetzel | |
| 5,628,555 A | 5/1997 | Sharrah et al. | |
| 5,816,683 A | 10/1998 | Christiansen | |

(Continued)

OTHER PUBLICATIONS

Streamlight, Inc., "Product Catalog," Jun. 2001, Front Cover, pp. 1, 8-11, 28-29, 32-33, Rear Cover.

(Continued)

*Primary Examiner*—Jong-Suk (James) Lee
*Assistant Examiner*—Julie A Shallenberger
(74) *Attorney, Agent, or Firm*—Clement A. Berard, Esq.; Dann, Dorfman, Herrell & Skillman, PC

(57) ABSTRACT

A light comprises a light body for supporting an illumination light source and for receiving a battery, a first light source disposed in the light body for selectively providing illumination; a cover for receiving an optional second light source; a switch for selectively energizing the first light source, the optional second light source, or both; and a circuit structure for receiving electrical potential and providing electrical connections among the first light source, the optional second light source, the switch, and the terminals. The circuit structure may include portions in different planes, and may include a separable connector whereby the optional second light source may be removable.

35 Claims, 12 Drawing Sheets

U.S. PATENT DOCUMENTS

| | | | |
|---|---|---|---|
| 5,913,669 | A | 6/1999 | Hansen et al. |
| 6,073,901 | A | 6/2000 | Richter |
| 6,115,952 | A | 9/2000 | Rigler |
| 6,185,854 | B1 | 2/2001 | Solinsky et al. |
| 6,230,431 | B1* | 5/2001 | Bear ........................... 42/117 |
| 6,276,088 | B1 | 8/2001 | Matthews |
| 6,378,237 | B1 | 4/2002 | Matthews |
| 6,574,901 | B1 | 6/2003 | Solinsky et al. |
| 6,609,810 | B2* | 8/2003 | Kim ........................... 362/110 |
| 6,612,714 | B1 | 9/2003 | Morre et al. |
| 2003/0007355 | A1 | 1/2003 | Leen |
| 2004/0068913 | A1 | 4/2004 | Solinsky et al. |
| 2004/0132342 | A1 | 7/2004 | Lien |
| 2004/0169119 | A1 | 9/2004 | Crowell et al. |
| 2006/0083008 | A1 | 4/2006 | Yu |
| 2006/0083009 | A1 | 4/2006 | Hsu |

OTHER PUBLICATIONS

Streamlight, Inc., "M2 Universal Tactical Light," Product Package, Prior to Oct. 24, 2006, 1 Page.
Streamlight, Inc., "M2 Universal Tactical Light," Operator's Manual, Oct. 2003, 2 Pages.
Streamlight, Inc., "M-3 LED Tactical Navigation Light," Dated: 2002, Eagleville, PA, 2 Pages.
Streamlight, Inc., "M-6 Tactical Laser Illuminator," Dated 2003, Eagleville, PA, 2 Pages.
Streamlight, Inc., "Introducing The All-New MIL-SPEC X-Series—Trusted Tactical Lights Taken To The X-treme," Dated: Oct. 2003, Eagleville, PA, 2 Pages.
Streamlight, Inc., "L.A.M. Laser Aiming Module," Dated 2000, Eagleville, PA, 1 Page.
Streamlight, Inc., "Tactical Series Specifications," http://www.streamlight.com/tactical_specifications.htm, Printed Oct. 28, 2004, 3 Pages.
Streamlight, Inc., "Tactical Series Parts & Accessories," Specifications, http://www.streamlight.com/tactical_accessories.htm, Printed Oct. 28, 2004, 2 Pages.
Streamlight, Inc., Streamlight M-3 LED, Streamlight Products, http://www.streamlight.com/m3led_specs.htm, Printed Oct. 28, 2004, 1 Page.
Streamlight, Inc., Streamlight M-6, M-6 Tactical Laser Illuminator Specifications, http://www.streamlight.com/m6_specifications.htm, Printed Oct. 28, 2004, 1 Page.
Streamlight, Inc., "Streamlight Laser Aiming Module (L.A.M.)," Streamlight Products, http://www.streamlight.com/lam_specs.htm, Printed Oct. 28, 2004, 2 Pages.
Streamlight, Inc., "X-Series Specifications", http://www.streamlight.com/x-series_specs.htm, Printed Oct. 28, 2004, 2 Pages.
Streamlight, Inc., "Tactical Gun Mount Series—TLR-1", http://www.streamlight.com/product/product.aspx?pid=80, Printed Sep. 18, 2006, 1 Page.
Streamlight, Inc., "Tactical Gun Mount Series—TLR-2 With Laser Sight", http://www.streamlight.com/product/product.aspx?pid=81, Printed Sep. 18, 2006, 1 Page.
First Samco, "Tactical Light Holder," First Samco Tactical Accessories for AR15 & M/16, http://www.firstsamco.com/catalog/productdetail.php?ID=4, Printed Nov. 4, 2004, 1 Page.
First Samco, "Images for Tactical Light Holder," First Samco Tactical Accessories for AR15 & M/16, http://www.firstsamco.com/catalog/moreimages.php?ID=4, Printed Nov. 4, 2004, 1Page.
Insight Technology, Inc., M2 UTL Universal Tactical Light (with Photos), © 2004, http://www.insightlights.com/products/showProduct.asp?id=1, Printed Nov. 8, 2005, 4 Pages.
Insight Technology, Inc., "M3X Tactical Illuminator," © 2004, http://www.insightlights.com/products/showProduct.asp?id=6, Printed Oct. 28, 2004, 2 Pages.
Insight Technology, Inc., "M6 Tactical Illuminator (with Photos)," © 2004, http://www.insightlights.com/products/showProduct.asp?id=9, Printed Oct. 28, 2004, 5 Pages.
Insight Technology, Inc., "M6X Tactical Illuminator (with Photos)," © 2004 http://www.insightlights.com/products/showProduct.asp?id=11, Printed Oct. 28, 2004, 6 Pages.
Insight Technology, Inc., "XML X-treme Mini Light", © 2004, http://www.insightlights.com/products/showProduct.asp?id=2, Printed Oct. 28, 2004, 1 Page.
Insight Technology, Inc., "Tactical Lights by Insight Technology Inc. (UTL, M3, LAM) -Products by Product Index", © 2001, http://www.insightlights.com/oldsite/prodbyproducts.htm, Printed Sep. 18, 2006, 1 Page.
Insight Technology, Inc., "Tactical Lights by Insight Technology Inc. (UTL, M3, LAM) -The M3 Tactical Light", © 2001, http://www.insightlights.com/oldsite/prod_m3.htm, Printed Sep. 18, 2006, 1 Page.
Insight Technology, Inc., "Tactical Lights by Insight Technology Inc. (UTL, M3, LAM) -M3 Photo Gallery", ©2001, http://www.insightlights.com/oldsite/gallery_m3.htm, Printed Sep. 18, 2006, 1 Page.
Insight Technology, Inc., "Tactical Lights by Insight Technology Inc. (UTL, M3, LAM) -The M3-LED Tactical Illuminator", © 2001, http://www.insightlights.com/oldsite/prod_m3led.htm, Printed Sep. 18, 2006, 2 Pages.
Insight Technology, Inc., "Tactical Lights by Insight Technology Inc. (UTL, M3, LAM)—M3-LED Photo Gallery", © 2001, http://www.insightlights.com/oldsite/gallery_m3led.htm, Printed Sep. 18, 2006, 1 Page.
Insight Technology, Inc., "Tactical Lights by Insight Technology Inc. (UTL, M3, LAM) -The M4 and M4-Pro Tactical Light", © 2001, http://www.insightlights.com/oldsite/pro_m4.htm, Printed Sep. 18, 2006, 1 Page.
Insight Technology, Inc., "Tactical Lights by Insight Technology Inc. (UTL, M3, LAM)—M4 & M4-Pro Photo Gallery", © 2001, http://www.insightlights.com/oldsite/gallery_m4.htm, Printed Sep. 18, 2006, 1 Page.
Insight Technology, Inc., "Tactical Lights by Insight Technology Inc. (UTL, M3, LAM) -The M5 Tactical Light", © 2001, http://www.insightlights.com/oldsite/prod_m5.htm, Printed Sep. 18, 2006, 1 Page.
Insight Technology, Inc., "Tactical Lights by Insight Technology Inc. (UTL, M3, LAM)—M5 Photo Gallery", © 2001, http://www.insightlights.com/oldsite/gallery_m5.htm, Printed Sep. 18, 2006, 1 Pg.
Insight Technology, Inc., "Tactical Lights by Insight Technology Inc. (UTL, M3, LAM) -The M6 Tactical Laser Illuminator", © 2001, http://www.insightlights.com/oldsite/prod_m6.htm, Printed Sep. 18, 2006, 2 Pages.
Insight Technology, Inc., "Tactical Lights by Insight Technology Inc. (UTL, M3, LAM)—M6 Photo Gallery", © 2001, http://www.insightlights.com/oldsite/gallery_m6.htm, Printed Sep. 18, 2006, 1 Pg.
Insight Technology, Inc., "Tactical Lights by Insight Technology Inc. (UTL, M3, LAM) -Laser Aiming Module (LAM)", © 2001, http://www.insightlights.com/oldsite/prod_lam.htm, Printed Sep. 18, 2006, 2 Pages.
Insight Technology, Inc., "Tactical Lights by Insight Technology Inc. (UTL, M3, LAM) LAM Photo Gallery", © 2001, http://www.insightlights.com/oldsite/gallery_lam.htm, Printed Sep. 18, 2006, 1 Pg.
Insight Technology, Inc., "Tactical Lights by Insight Technology Inc. (UTL, M3, LAM) -Parts & Accessories Photo Gallery", © 2001, http://www.insightlights.com/oldsite/gallery_access.htm, Printed Sep. 18, 2006, 2 Pages.
Surefire, "Laser Sights," Weapon mounted laser sights from SureFire, © 2001-2004, http://www.surefire.com/maxexp/main/co_disp/displ/pgrfnbr/364/sesent/00, Printed Oct. 28, 2004, 1 Pg.
Surefire, "Weapon Lights," Lights for weapons including handguns, shotguns, and rifles, © 2001-2004, http://www.surefire.com/maxexp/main/co_disp/displ/pgrfnbr/211/sesent/00, Printed Oct. 28, 2004, 1 Pg.
Surefire, "Handgun Weapon Lights," Handgun Tactical WeaponLights provided by SureFire, © 2001-2004, http://www.surefire.com/maxexp/main/co_disp/displ/carfnbr/91/sesent/00, Printed Oct. 28, 2004, 2 Pages.

Surefire, "Products," X200 WeaponLight—X200 available from SureFire, © 2001-2004, http://www.surefire.com/maxexp/main.pl?pgm-co_disp&func-displ&strfnbr=6&prrfnbr=1110& . . . , Printed Oct. 28, 2004, 2 Pages.

Surefire, "SureFire Integrated Shotgun WeaponLights," Shotgun WeaponLights provided by SureFire, © 2001-2004, http://www.surefire.com/maxexp/main/co_disp/displ/carfnbr/92/sesent/00, Printed Oct. 28, 2004, 1 Page.

Surefire, "Rifle, Carbine & SMG Light Systems", Rifle, Carbine & SMG WeaponLights Systems provided by SureFire, © 2001-2004, http://www.surefire.com/maxexp/main/co_disp/displ/carfnbr/93/sesent/00, Printed Oct. 28, 2004, 1 Page.

Surefire, "Rifle, Carbine & SMG Light Systems," Millennium Forends provided by SureFire, © 2001-2004, http://www.surefire.com/maxexp/main/co_disp/displ/carfnbr/265/sesent/00, Printed Oct. 28, 2004, 1 Page.

Surefire, "Rifle, Carbine & SMG Light Systems," Millennium Universal WeaponLights provided by SureFire, © 2001-2004, http://www.surefire.com/maxexp/main/co_disp/displ/carfnbr/267/sesent/00, Printed Oct. 28. 2004, 1 Page.

Surefire, "Rifle, Carbine & SMG Light Systems," Millennium Vertical Foregrip System provided by SureFire, © 2001-2004, http://www.surefire.com/maxexp/main/co_disp/displ/carfnbr/266/sesent/00, Printed Oct. 28, 2004, 1 Page.

Surefire, "Rifle, Carbine & SMG Light Systems," Classic Series WeaponLights provided by SureFire, © 2001-2004, http://www.surefire.com/maxexp/main/co_disp/displ/carfnbr/271/sesent/00, Printed Oct. 28, 2004, 1 Page.

Surefire, "Weapon Mounts," SureFire Weapon Mounts, © 2001-2004, http://www.surefire.com/maxexp/main/co_disp/displ/pgrfnbr/378/sesent/00, Printed Oct. 28, 2004, 1 Pg.

Surefire, "Products Weapon Mounts,"Picatinny forends provided by SureFire, © 2001-2004, http://www.surefire.com/maxexp/main/co_disp/displ/carfnbr/312/sesent/00, Printed Oct. 28, 2004, 1 Pg.

Surefire, "Products Weapon Mounts,"S.I.R. System C (Selective Integrated Rail)—M61 available from SureFire, © 2001-2004, http://www.surefire.com/maxexp/main/co_disp/displ/prrfnbr/824/sesent/00, Printed Oct. 28, 2004, 1 Page.

International Search Report, PCT/US05/41002, Nov. 17, 2006.

Falcon Tactical, "Sig Sauer Stoplite Vertical Grip with Weaponlight", http://www.falcontactical.net/sigsastvegrw.html, © 2006-2009, 2 pages.

* cited by examiner

SECTION 8-8

MOUNTABLE LIGHT PROVIDING ILLUMINATION AND OPTIONALLY AIMING

This Application is a division of U.S. patent application Ser. No. 11/268,787 filed Nov. 8, 2005 now U.S. Pat. No. 7,188,978, which claims the benefit of the priority of U.S. Provisional Patent Application No. 60/627,860 filed Nov. 15, 2004, all of which are incorporated herein by reference.

The present invention relates to a mountable light that may include an illumination source and may optionally include a second light source.

Lights may be held in hand or may be mounted to an object. Lights may be mounted to various objects, such as tools or implements so that they provide light directed toward the work area of the working end of the tool or implement. Tools or implements of this sort typically have a mounting rail attached thereto, e.g., by the manufacturer, by a seller or by a user. One object to which lights may be mounted is a firearm, such as a handgun or pistol, a long gun or rifle, a shotgun, or another type of gun or weapon, any one or more of which are typically referred to as a gun. Gun mountable lights may be for illumination or for aiming, or both. Lights for illumination typically utilize a lamp such as an xenon-filled or a halogen-filled lamp or a high-powered light-emitting diode (LED) light source. Lights for aiming typically utilize a laser diode or other laser light source.

The arrangement for mounting such lights on a gun is, for the typical gun, similar to the arrangement for mounting a telescopic sight on a gun. A gun mount, also called a gun rail or a mounting rail, is typically provided in a convenient location that affords a forward-looking view for a light mounted thereon. Because a telescopic sight or other sight is typically mounted on the top or upper surface of the gun barrel, a separate mount is often provided on the side or underside (bottom) surface of the gun barrel, typically near to the muzzle end thereof.

Conventional gun-mountable lights typically have a plastic body having cleats that slide onto the gun mount and have a spring-loaded cross bar that snaps into a slot on the gun mount when the light is slid onto the gun rail to a desired position. The spring-loaded cross bar provides sufficient tension to secure the light on the gun rail when the gun is fired, and has protruding ends that can be manipulated for disengaging the cross bar so that the light can be removed, i.e. can be slid off of the gun rail. Such slide-on mounts typically do not provide a snug fit on the mounting rail, and so there is substantial play which introduces variation into the direction in which the mounted object points, and so such play is generally undesirable.

Different gun manufacturers provide gun rails that differ in shape and/or size and/or configuration, and some so that a conventional gun-mountable light can only properly mount on gun rails of particular guns or from particular manufacturers. As a result, a gun owner would have to have different lights for his guns from different manufacturers. In addition, slide-on type gun mounted objects can not mount without play and in a repeatable manner as is necessary for an aiming type of device.

In addition, many conventional gun mounts require a hand placement by a user when attaching or removing the gun-mountable object that may place the user's hand or part thereof in front of the muzzle, thereby placing the user in danger of injury should the firearm unintentionally discharge.

Accordingly, there is a need for a light that may include an illumination source or that may include an illumination source and an aiming light source. In addition, it would be desirable that such lights have certain elements in common so that they may relatively easily be configured to include an illumination source or to include an illumination source and an aiming light source.

To this end, a light according to the present arrangement comprises a light body for supporting a first light source; a first light source disposed in the light body for selectively providing illumination; a cover for receiving an optional second light source; a switch for selectively energizing the first light source, the optional second light source, or both; and a circuit structure for receiving electrical potential and providing electrical connections among the first light source, the optional second light source, the switch, and the terminals.

According to another aspect, an electrical circuit structure for a light may comprise: at least first and second circuit portions disposed in different planes and having electrical conductors thereon, the first circuit portion having a shape corresponding to the shape of a mounting surface adjacent to which it is adapted to be mounted, the first circuit portion having an opening therein in a predetermined location relative to the shape thereof, wherein the opening is for receiving a light source; a light source mounted in the opening of the first circuit portion for receiving electrical energy from the electrical conductors; and a switch mounted to the second circuit portion for selectively applying electrical energy to at least one of the electrical conductors thereon for selectively energizing the light source.

BRIEF DESCRIPTION OF THE DRAWING

The detailed description of the preferred embodiment will be more easily and better understood when read in conjunction with the FIGURES of the Drawing which include:

FIG. 2 comprising

Figure 1:
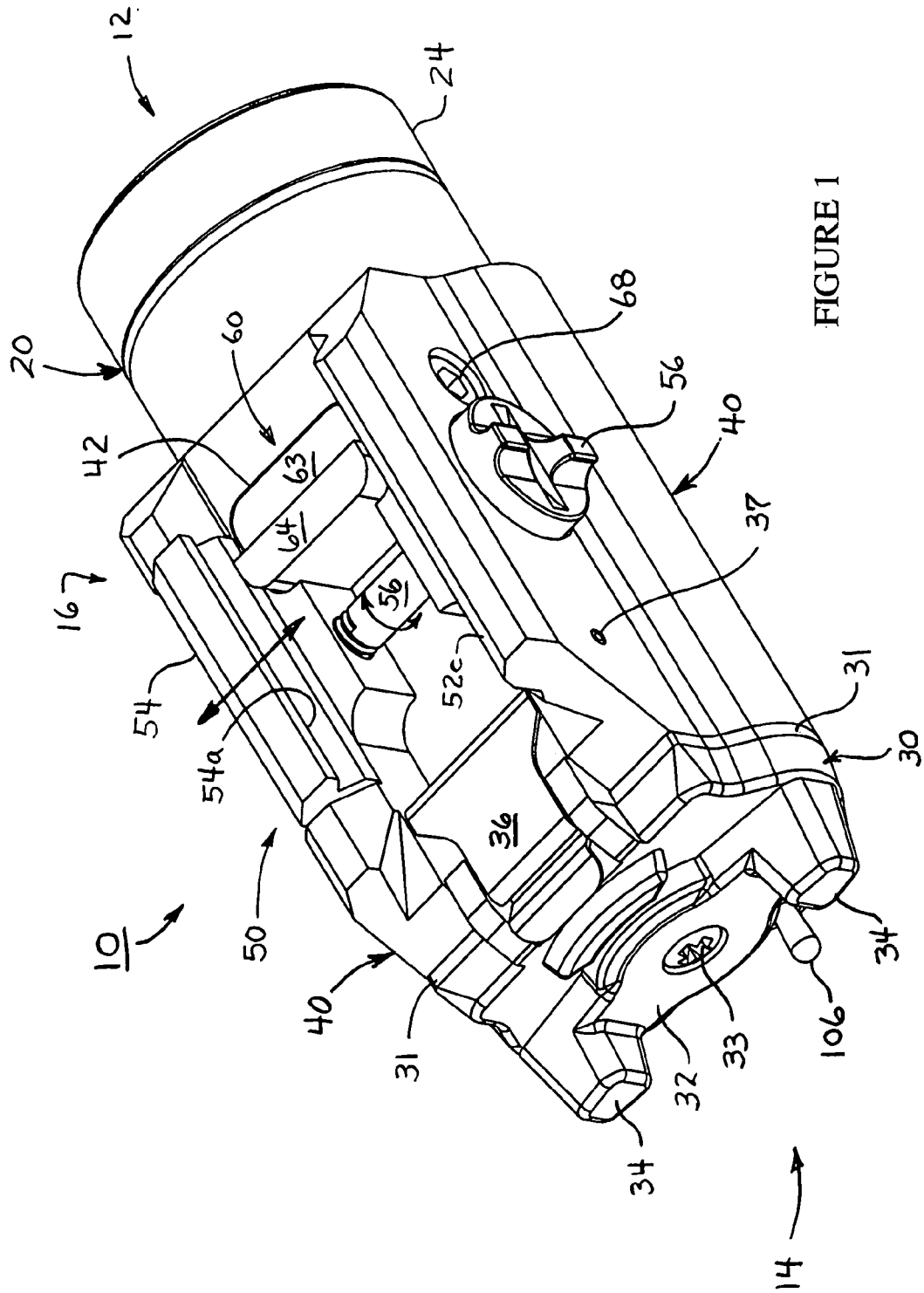
FIG. 1 is an isometric view of an example embodiment of a mountable light as described herein.

In the Drawing, where an element or feature is shown in more than one drawing figure, the same alphanumeric designation may be used to designate such element or feature in each figure, and where a closely related or modified element is shown in a figure, the same alphanumerical designation primed or designated "a" or "b" or the like may be used to designate the modified element or feature. It is noted that, according to common practice, the various features of the drawing are not to scale, and the dimensions of the various features are arbitrarily expanded or reduced for clarity.

DESCRIPTION OF THE PREFERRED EMBODIMENT

Figure 2A:
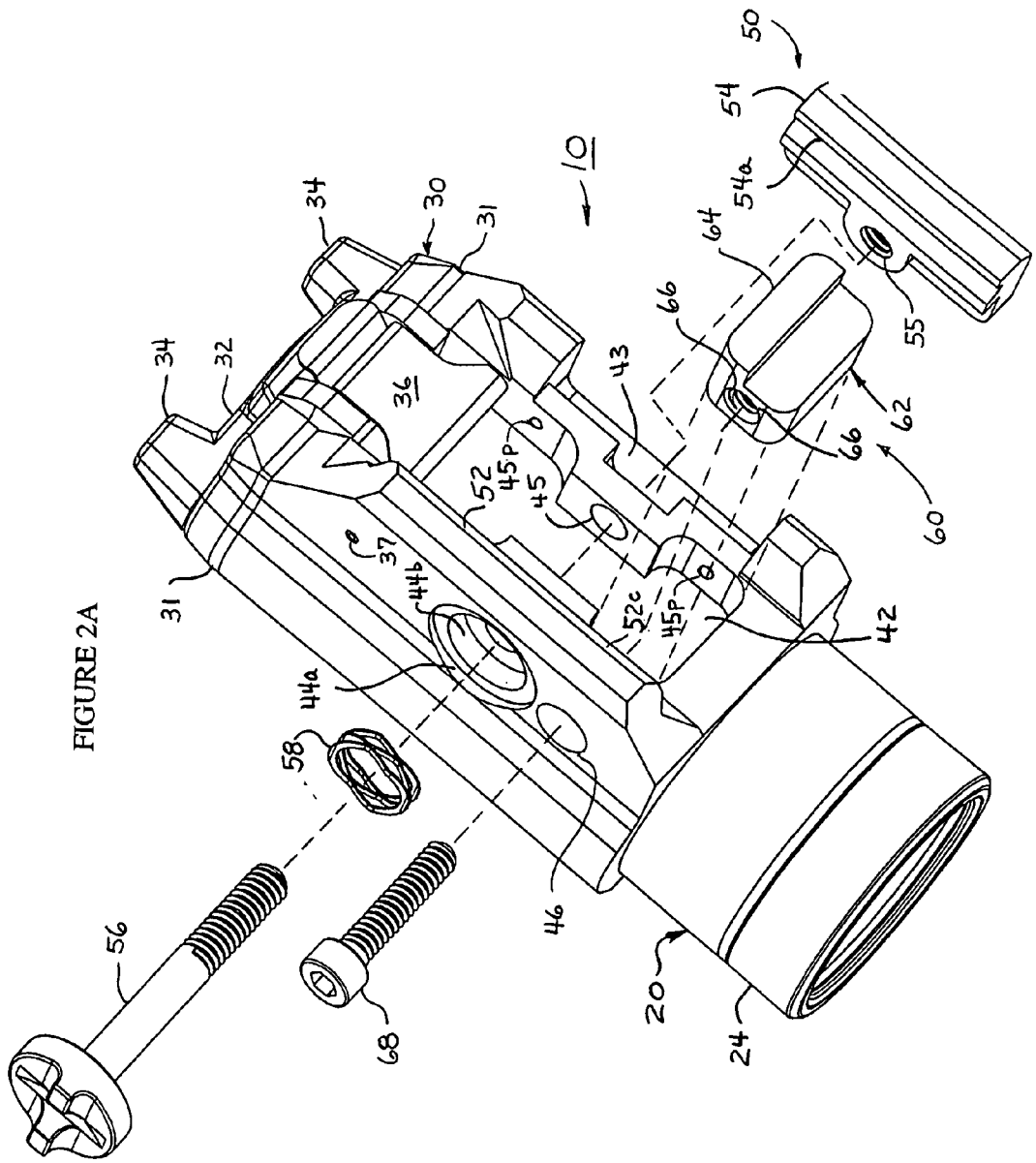
FIGS. 2A and 2B are exploded isometric views of the example embodiment of a mountable light of FIG. 1.
Figure 2B:
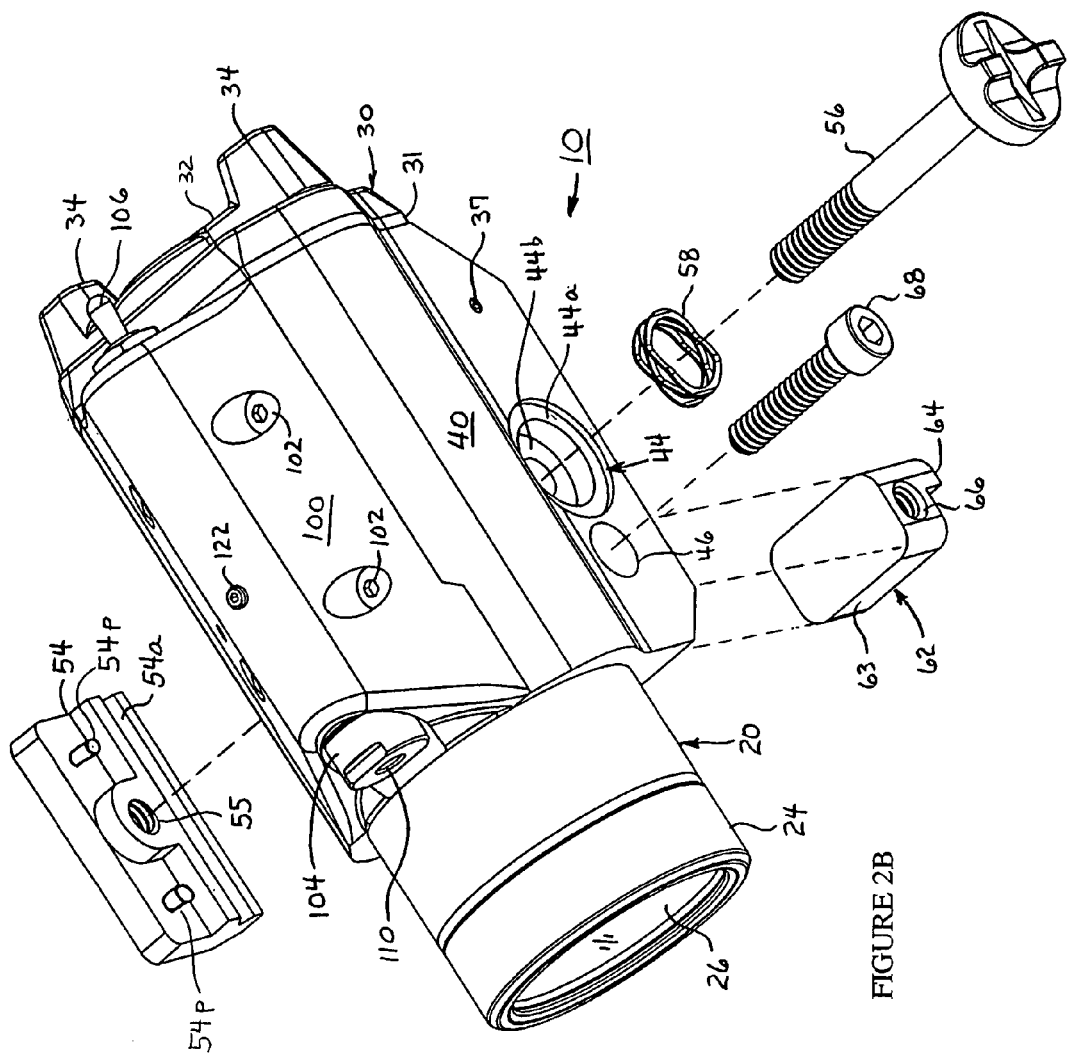
Figure 3:
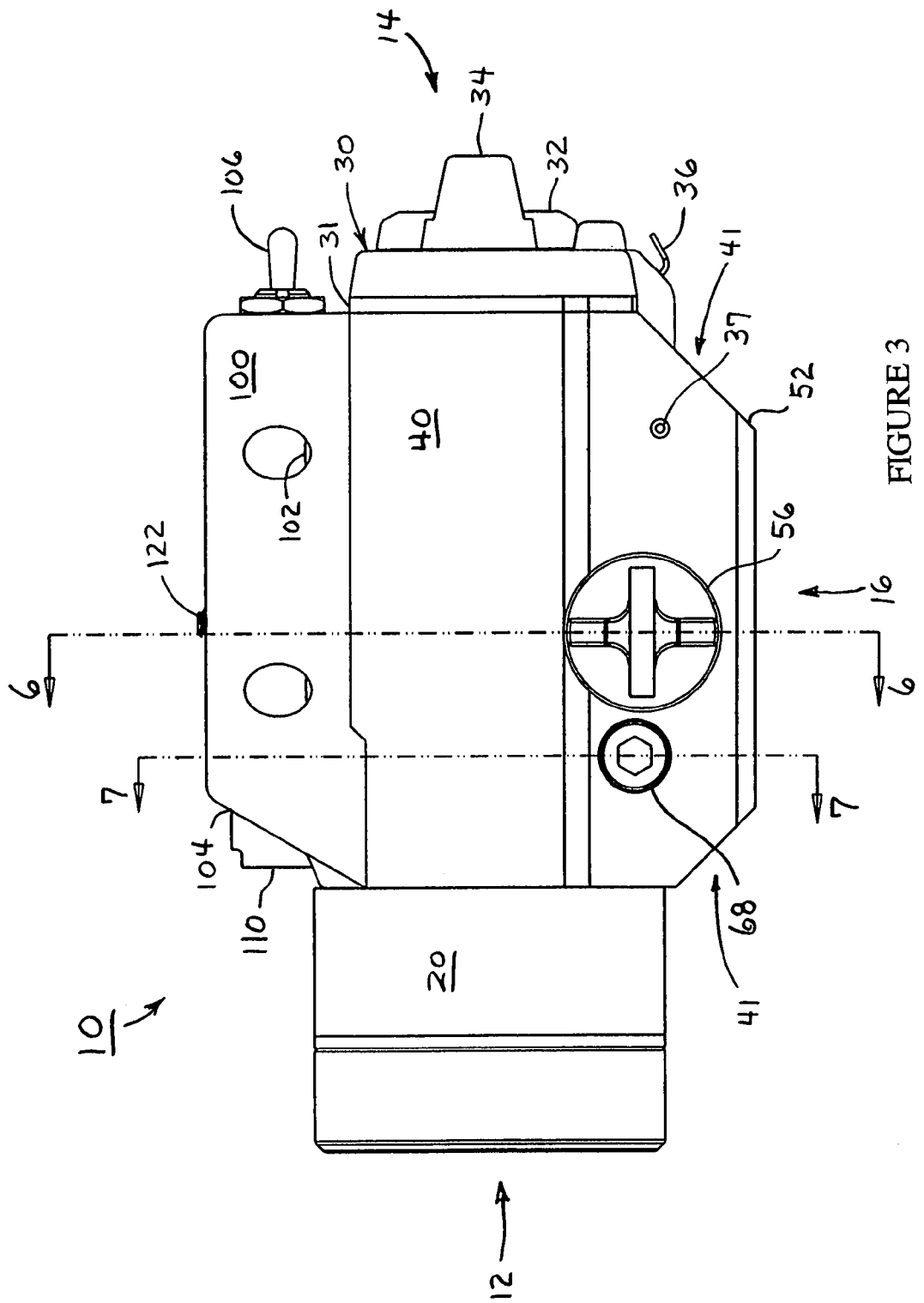
FIG. 3 is a side view of the example embodiment of a mountable light of FIGS. 1, 2A and 2B.
Figure 4:
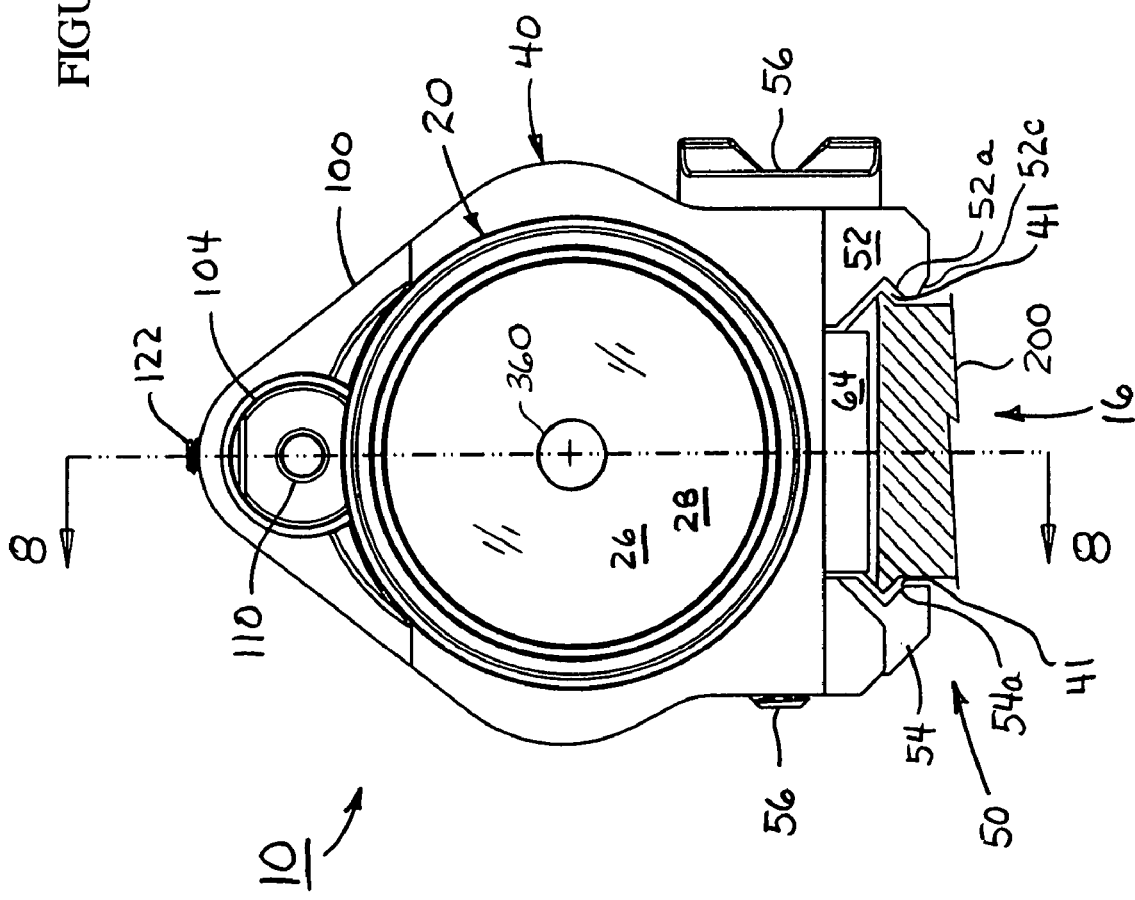
FIG. 4 is a view of the example embodiment of a mountable light of FIGS. 1-3 showing the light producing end thereof.
Figure 5:
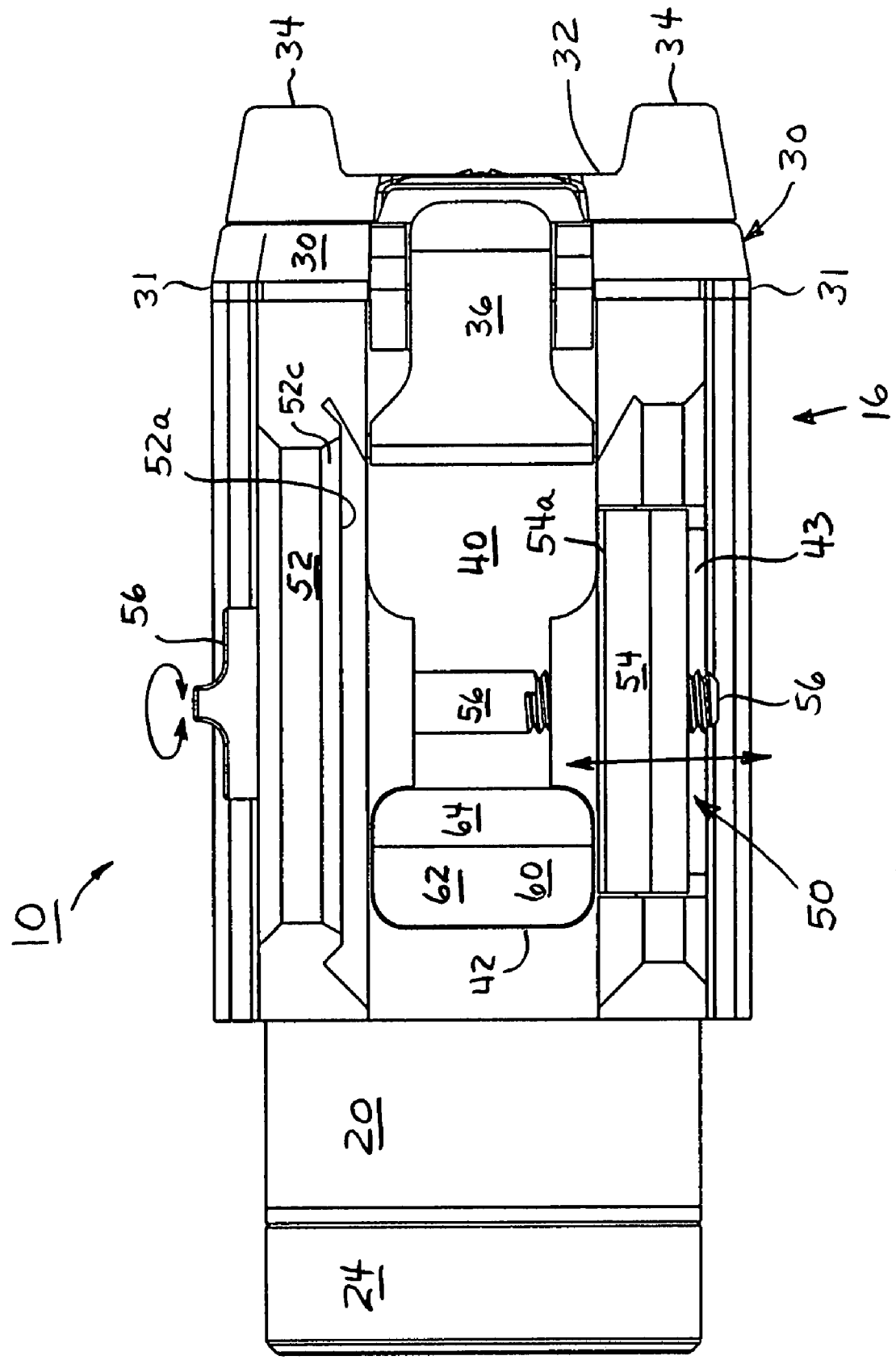
FIG. 5 is a view of the example embodiment of a mountable light of FIGS. 1-4 showing the mounting arrangement thereof.

FIG. 1 is an isometric view and FIGS. 2A and 2B are exploded isometric views of an example embodiment of a mountable light 10 as described herein, and FIGS. 3-5 are other external views of light 10. Light 10 will be described with reference to FIGS. 1-5 generally. Where a feature being described is not visible in one or more of FIGS. 1-5 or may be better seen in a particular FIGURE, reference may be made to the particular FIGURE.

Light 10 has a forward or head end 12 from which light is emitted when light 10 is activated and has a rearward or tail end 14 opposite head end 12. Tail end 14 includes, e.g., various switches and controls 32, 106, for controlling operation of the light sources of light 10. Light 10 further has a mounting face 16 whereat are the various arrangements for mounting light 10 to a mounting rail, e.g., a mounting rail 200 of a gun, an example of which is shown in and described in relation to FIG. 9. The direction between head end 12 and tail end 14 of light 10 may be referred to herein as "longitudinal" and a direction perpendicular thereto as "transverse." Thus, light can be said to be emitted from head end 12 of light 10 in or along the longitudinal direction or axis.

Light body 40 of light 10 is the principal structural member thereof, providing various structural features, openings and recesses adapted for the various mechanisms and electrical components and circuits that may comprise light 10.

Light 10 is mounted and secured to a mounting rail, e.g., a mounting rail 200 of a gun, by a clamping arrangement 50 and a keying arrangement 60 disposed on mounting face 16 of light body 40. Specifically, a longitudinal fixed clamp member 52 extends outwardly from light body 40 to provide a surface 52a against which a side rail 206 of a mounting rail 200 may bear. Opposing fixed clamp member 52 is movable clamp member 54 which is movable toward and away from fixed clamp member 52. Fixed clamp member 52 and movable clamp member 54 define a cavity or space 41 therebetween into which a mounting rail is placed for being engaged by clamp members 52, 54, e.g., by engaging respective faces 52a, 54a thereof. Cavity 41 is sometimes referred to as a rail guide cavity.

Specifically, movable clamp member 54 moves transversely (indicated by a straight double-ended arrow) in recess or channel 43 of light body 40 responsive to rotation of clamp screw 56 (indicated by an arcuate double-ended arrow). Clamp screw 56 is disposed through hole 44 which is through fixed clamp 52 and through a hole 45 coaxial therewith which is through a boss on light body 40 to engage a threaded hole 55 in and through movable clamp member 54. With a right hand thread, turning clamping screw 56 clockwise causes movable clamp member 54 to move transversely towards fixed clamp member 52, e.g., for engaging and clamping a mounting rail therebetween. Turning clamping screw 56 counterclockwise causes movable clamp member 54 to move away from fixed clamp member 52, e.g., to release a mounting rail therebetween. Clamping screw 56 may have a left hand thread, in which case the rotational directions would be reversed.

Wave spring 58 is disposed on the shank of clamp screw 56 and preferably is not attached either to screw 56 or to light body 40. Spring 58 is free to move along the shank of screw 56 and in counterbore 44b. Wave spring 58 biases movable clamp member 54 towards the clamping area so that light 10 may be "snapped" onto a mounting rail from the side, after which screw 56 may be tightened from the side of light 10. The bias provided by spring 58 may be overcome by pressing on the head of screw 56 to move screw 56 towards light body 40 thereby to move movable clamp member 54 away from fixed clamp member 52, thereby to aid in snapping light 10 onto a mounting rail.

To facilitate mounting light 10 in a snap-on, snap-off manner, fixed clamp member 52 may have a chamfer 52c along an edge thereof that contacts a mounting rail 200 for easing its movement with respect to a mounting rail 200, or movable clamp member 54 may have a similar chamfer along an edge thereof, or both fixed clamp member 52 and movable clamp member 54 may have respective chamfers along respective edges.

Preferably, hole 44 is counterbored for receiving wave spring 58 which, in addition to biasing clamp member 52 towards clamp member 54, tends to assist clamp screw 56 to resist turning without having to fully seat the head of screw 56 to the bottom of the counterbore of hole 44, however, screw 56 may be fully seated if desired. Preferably, hole 44 is double counterbored in that a smaller-diameter deeper counterbore 44b of sufficient diameter for receiving wave spring 58 is provided, and a larger-diameter shallower counterbore 44a is of sufficient diameter for receiving the head of clamp screw 56. The depth of smaller-diameter counterbore 44b beyond the depth of larger-diameter counterbore 44a is preferably greater than the fully compressed length of wave screw 58 so that the head of clamp screw 56 may be advanced into contact with the shoulder formed at the bottom of the larger-diameter counterbore 44a of hole 44. Thus, clamp screw 56 may be advanced to a point whereat movable clamp member 54 is biased toward fixed clamp member 52 by wave spring 58 or clamp screw 56 may be advanced further to make hard contact between clamp screw 56 and both of clamp members 52, 54.

Optionally, but preferably, movable clamp member 54 may have one or more posts 54p extending therefrom in a direction towards light body 40 and fixed clamp member 52 for extending into one or more corresponding holes 45p in light body 40 for maintaining a desired alignment of clamp member 54 with respect to light body 40. Posts 54p help maintain alignment of movable clamp member 54, for example, when movable clamp member 54 moves transversely toward or away from fixed clamp member 52 when clamp screw 56 is pressed or released, or when clamp screw 56 is rotated.

The arrangement of light 10 as illustrated in FIG. 1 has clamp screw 56 on the right side (e.g., as would be viewed by a user pointing the light away from himself) when the light is in a "clamp up" orientation, as would be convenient for attaching light 10 to a mounting rail on the underside of a weapon using the right hand. Light 10 may have a "mirror" or reversed arrangement of clamping arrangement 50 with respect to light body 40 wherein fixed clamp member 52 and clamp screw 56 are on the left side (opposite to that illustrated) so as to be convenient for attachment to an underside mounting rail with the left hand. In such mirror arrangement of clamp 50, clamp members 52, 54, and clamp screw 56, are on the opposite sides of light body 40 to that illustrated. Both arrangements of light 10 are desirable, because light 10 may be mounted to the underside or to the top side of an object, and because any given light 10 may be utilized with either the right hand or the left hand, depending upon the user and the circumstance.

As a result of this arrangement, light 10 may be tightly and accurately mounted to a mounting rail in a known, fixed and repeatable position, as is important, e.g., where light 10 is or includes an aiming light, such as a laser 110. In addition, where clamping screw 56 is not fully advanced and so movable clamp 54 is held against mounting rail 200 by the force of compressed wave spring 58, movable clamp member 54 may move outward sufficiently to release light 10 from mounting rail 200, thereby allowing for an easy snap-on snap-off mounting and demounting of light 10. In a preferable embodiment of clamp screw 56, the head thereof includes a slot suitable for receiving a coin or a screwdriver for tightening and loosening screw 56, as well a two raised projections to facilitate finger tightening and loosening.

Having clamp screw 56 (or a suitable fixed alternative) adjusted to an appropriate position will allow light 10 to be mounted and demounted using the snap-on and snap-off action afforded by movable clamp member 54 moving against the bias of spring 58, without having to adjust clamp screw 56 unless a tighter mounting is desired. The clamping action of clamp arrangement 50 when snapped onto a gun mounting rail has been found satisfactory in aiming and firing tests of certain guns, although tightening of clamp screw 56 for a more secure mounting may be desirable for high-powered weapons. Thus, a fixed pin or fixed screw may be utilized in place of screw 56 to provide a button pressable by the user for mounting and demounting light 10 as is now provided by the head of clamp screw 56. Having lights 10 with clamps 50 both in non-mirror and mirror arrangements would allow ease of use for both topside and underside mounting, as well as for right-handed and left-handed users.

Mounting arrangement 50 allows a light 10 or another object utilizing mounting arrangement 50 to be mounted and demounted from a weapon (or a tool, implement or other object) from the side thereof, whether the light 10 or object is snapped on and off or whether clamp screw 56 is pressed as a button or is rotated. This is an advantageous safety feature because mounting and demounting can be accomplished with one hand and without the user having to place any part of his body in front of the muzzle of the weapon.

Clamping arrangement 50 is effective for securing light 10 with respect to both transverse and longitudinal movement. Additional resistance to longitudinal movement, e.g., as might result from an extreme mechanical disturbance or force, as in a discharge of a high-power firearm, may be provided. Keying arrangement 60 is provided for resisting longitudinal movement of light 10 along a mounting rail. Keying arrangement 60 includes a key member 62 removably disposed in a key recess 42 of light body 40. Key member 62 preferably includes a body 63 of similar size and shape to key recess 42 so as to be receivable therein in a suitable position and with suitable tolerance. Key member 62 has a keying feature 64 extending from key body 63, and keying feature 64 is of a size and shape, and in a position, for engaging a corresponding keying feature in the mounting rail to which light 10 will be mounted.

Because the mounting rails of various guns, tools and other objects to which light 10 may be mounted can have different configurations, key member 62 is selected to have a keying feature of corresponding size and shape and position to the keying feature of the mounting rail. Thus, a number of different key members 62 may be available so that light 10 may be mounted to mounting rails of different configurations. Key members 62 may be interchangeable and replaceable where the size and shape of keying body 63 and key recess 42 are predetermined and standardized, as is preferred. Such key members 62 may be made available individually or in sets, or both, and may be provided with a light or as an accessory or option.

Key member 62 is secured in key recess 42 by key screw 68 which is disposed through hole 46 of light body 40 and threaded into threaded hole 66 of key member 62. Key member 62 is replaceable by removing key screw 68 and then removing key member 62 from key recess 42, and a replacement key member 62 is installed by placing the key body 63 thereof in key recess 42, inserting key screw 68 through hole 46 and into threaded hole 66, and tightening key screw 68. Key screw 68 is preferably disposed transversely through light body 40 to engage key member 62.

Because the position of key 62 with respect to light 10, and specifically with respect to fixed clamp member 52 and movable clamp member 54, is predetermined because the location of key recess 42 of light body 40 is predetermined, the position of key 64 is also predetermined when key member 62 is disposed in key recess 42. Thus, a key member 62 may be particularly adapted for a particular mounting rail configuration by properly determining the length and width of key 64, the height of key 64 above key member body 63, and the position of key 64 on key member body 63.

Because the dimensions and configurations of the various mounting rail configurations are known, key members 62 properly configured to engage each configuration of mounting rail may be provided. If light 10 is to be mounted, for example, to a mounting rail 200 (FIG. 9) having a transverse slot or groove 208 therein, then a key member having a projecting generally rectangular transverse key 64 as illustrated is satisfactory. The particular shape of key 64 may be less important so long as the faces of key 64 that engage the keying feature of the mounting rail (e.g., parallel opposing faces of key 64 that engage the sides of a slot 208 in a mounting rail 200) are of suitable size and spacing. For example, where a keying slot 208 extends the full width of a mounting rail 200, a corresponding key 64 may be substantially shorter than the length of slot 208. Key 64 may be rectangular, square, cylindrical, circular, or any other shape corresponding to the shape of the keying feature of a mounting rail, or at least the operative surfaces thereof.

As a result, light 10 may be tightly and accurately mounted to a mounting rail in a known, fixed and repeatable position, both longitudinally and transversely, as is important, e.g., where light 10 is or includes an aiming light, such as a laser 110, or a sight.

Figure 8:
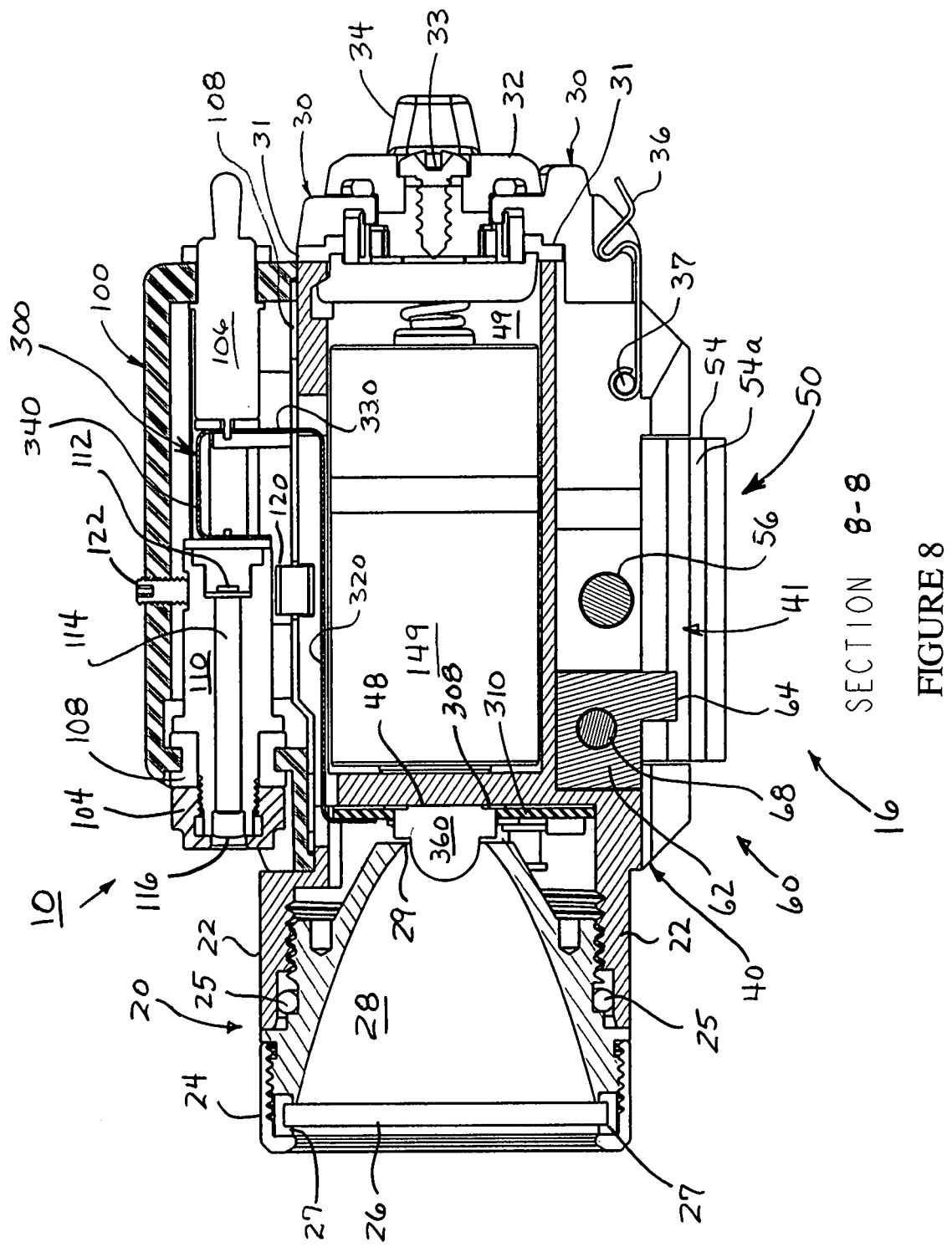
FIG. 8 is a sectional view of the example embodiment of a mountable light of FIGS. 1-5 taken at section 8-8 thereof.

Head 20 of light 10 is at the head end 12 thereof and includes the various elements relating to providing the light beam emitted by light 10. Referring to FIG. 8, for example, head 20 includes a head body 22 and a face cap 24 threaded thereon. Lens 26 is held in face cap 24 and is cushioned by a resilient gasket 27 that absorbs shock, e.g., shock generated when a gun to which light 10 is mounted is fired.

Reflector 28 is threaded into head body 22 and provides shaping and focusing of the light produced by light source 360 when light source 360 is energized for producing light. Reflector 28 has an opening 29 at the rearward end thereof into which light source 360 extends. The threaded interface between reflector 28 and head body 22 may be sealed, e.g., by a seal or gasket, such as O-ring 25, so as to resist entry of moisture and other undesirable substances. The interface between face cap 24 and lens 26 is similarly sealed by shock absorbing gasket 27.

Cover 30 is at the rearward end 14 of light 10 and light body 40 and covers the open end of a battery compartment 49 of light body 40. Cover 30 provides access to battery cavity or compartment 49 within light body 40 wherein are disposed batteries 149, as may be seen in FIGS. 6, 7 and 8. Batteries 149 are for providing electrical energy for operating light source 360 and/or laser 110 of light 10. Contacts that receive the positive and negative terminals of batteries 149 may include raised portions and recessed portions that allow batteries 149 to be connected only in the correct polarity.

Cover 30 is urged against light body 40 and held thereagainst by hinged latch 36 which is hinged on hinge pin 37 which passes through two opposing coaxial holes in body 40. Latch 36 snaps onto and off of a ridge of cover 30 to respectively secure and release cover 30 from light body 40. Cover 30 is sealed by gasket 31 under compression from the action of latch 36 to resist, e.g., entry of moisture into the interior of light body 40.

In the example illustrated, cover 30 includes a switch actuator 32 that serves as an ON/OFF actuator for the light source of light 10. Switch actuator 32 has two paddles 34 that extend rearwardly against which a user may press to cause switch actuator 32 to rotate in the clockwise or counterclockwise direction about the longitudinal axis of light 10 for actuating and deactuating light 10. One of paddles 34 usually tends to be more convenient for a left handed user and the other for a right handed user, irrespective of the mounting orientation of light 10 on a gun. Actuator 32 is held in place by screw 33 about which it is rotatable, e.g., as may be seen in FIG. 8.

Laser housing 100 is disposed on light body 40 and is typically secured thereon by screws 102. Gasket 108 between housing 100 and body 40 provides resistance to entry of moisture and other undesirable substances. Laser cartridge 110 includes a laser source 112, a laser light tube 114 and a laser lens 116 therein for directing a beam of laser light longitudinally in the same direction as the light from head 20, as may be appreciated from FIG. 8. Laser cartridge 110 is held in laser housing 100 by collar 104 bearing against a rubber grommet 108. Mode selector switch 106 is disposed at the rear of laser housing 100 where the toggle handle thereof is convenient for operation by a user for selecting among various modes, e.g., a laser-only mode, a light-only illumination mode, a both laser and illuminating light mode, and a neither laser nor illuminating light mode, i.e. an OFF mode.

Because laser 110 is utilized as an aid to aiming of the firearm on which light 10 including laser 110 is mounted, alignment or bore-sighting of laser cartridge 112 relative to the line of fire of the firearm is desirable. To this end, aiming set screws 122, 124 are provided for respectively adjusting elevation and windage. The position of laser cartridge 110 in housing 100 may be adjusted by means of aiming adjustment screws 122, 124 for boresighting a firearm having light 10 mounted thereon by mounting arrangement 50.

Figure 6:
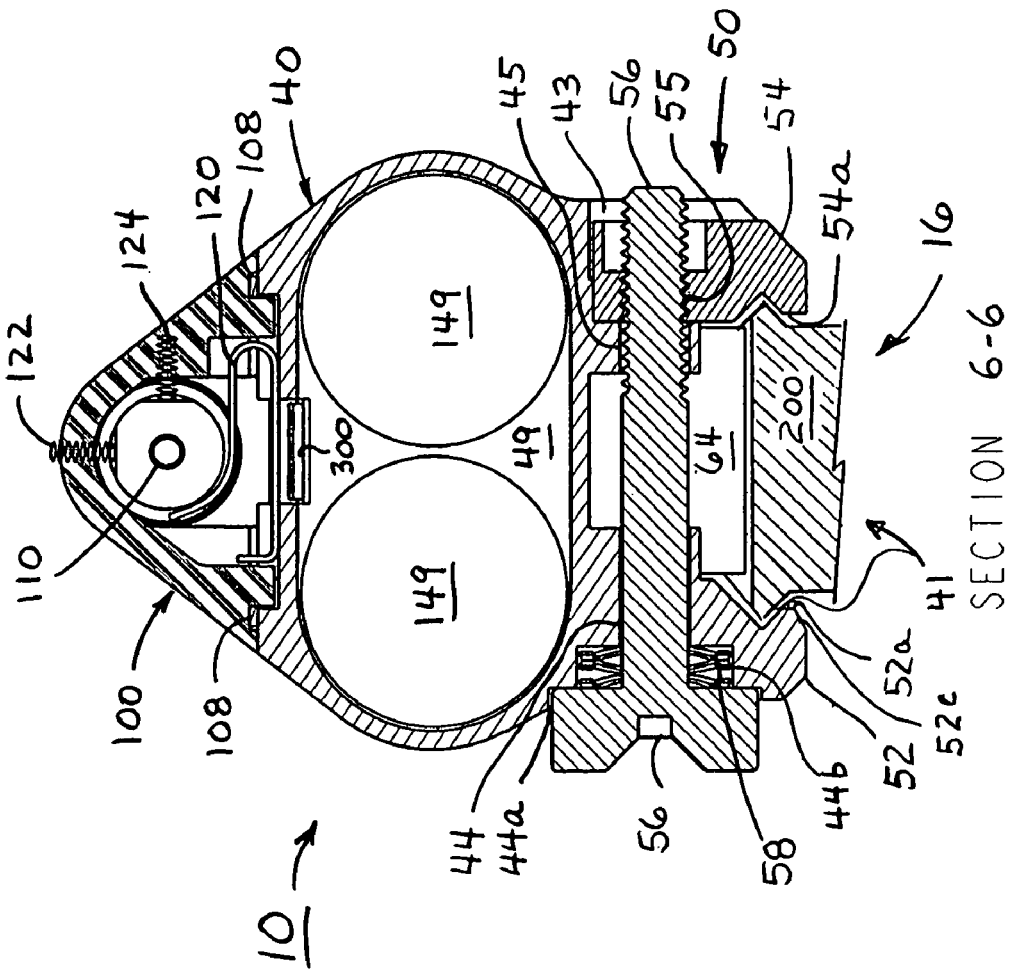
FIG. 6 is a sectional view of the example embodiment of a mountable light of FIGS. 1-5 taken at section 6-6 thereof.
Figure 7:
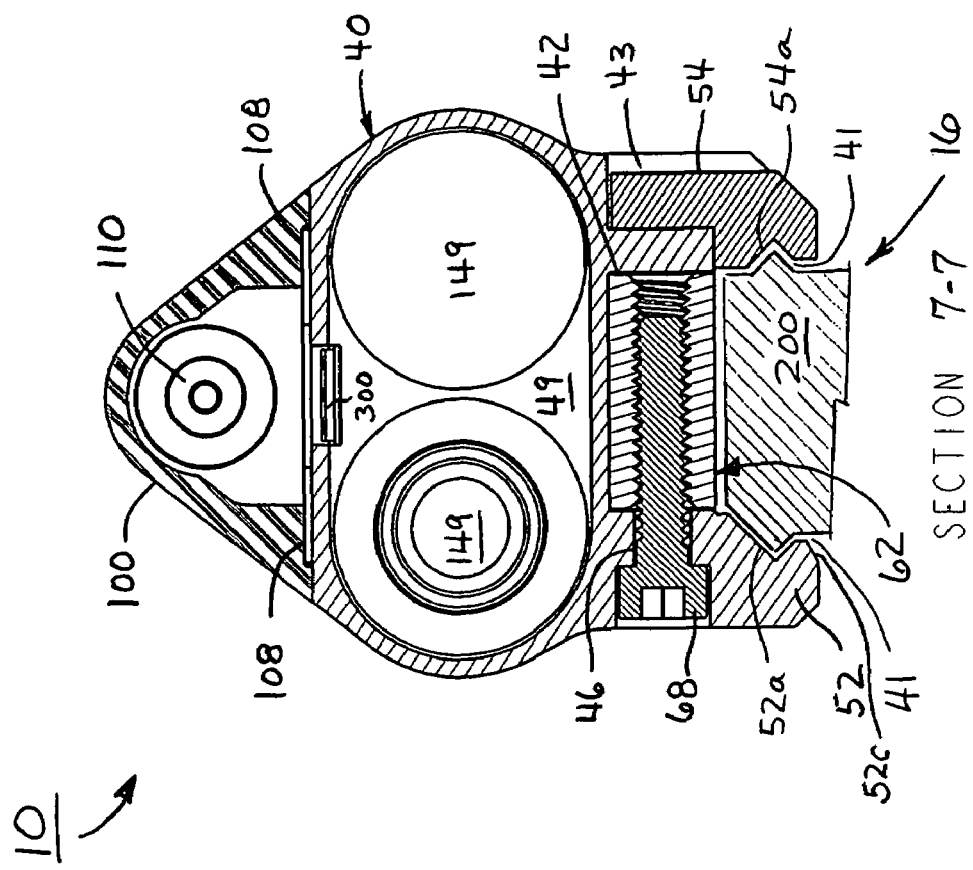
FIG. 7 is a sectional view of the example embodiment of a mountable light of FIGS. 1-5 taken at section 7-7 thereof.

Specifically, laser cartridge 110 is urged toward housing 100 by spring 120, e.g., generally upward and rightward as seen in the view of FIG. 6, and the bias provided by spring 120 may be counteracted by aiming adjusting screws 122, 124. Spring 120 may be a leaf spring 120 as illustrated, or may be a coil spring, a conical spring, or any other spring, as may be desired. The rearward end of laser cartridge is able to be moved by elevation adjustment screw 122 and by windage adjustment screw 124 because laser cartridge 110 is supported at its forward end by a resilient or rubber gasket 108 that engages a circular flange on housing 100 and is compressed between collar 104 and a shoulder on laser cartridge 110. Grommet 108 is resilient which allows laser cartridge to be moved relative to laser housing 100 in response to advancing and withdrawing elevation and windage adjustment screws 122, 124.

It is noted that laser housing 100 and laser cartridge 110 may be omitted, i.e., may be an optional feature, in which case a cover would replace laser housing 100 on light body 40. Head 20, cover 30, light body 40, and laser housing 100 may be of the same or of different materials, such as nylon, plastic or metal, such as an aircraft-grade aluminum, and the various screws, e.g., screws 33, 56, 68, 102, may be of steel or other suitable material. Where body 40 and/or housing 100 are of nylon or plastic, metal inserts may be utilized in the holes therein to increase the resistance of the various holes to stripping by the screws that are threaded therein. Lens 26 may be of a plastic, such as polycarbonate, or a glass. In a preferred example embodiment, light source 360 is a three-watt Luxeon light-emitting diode available from Lumileds Lighting LLC, located in San Jose, Calif., laser cartridge 110 may be a visible or infrared laser available from Sanyo Semiconductor Corporation, located in Allendale, N.J., and light 10 may be powered by lithium batteries 149.

Figure 9:
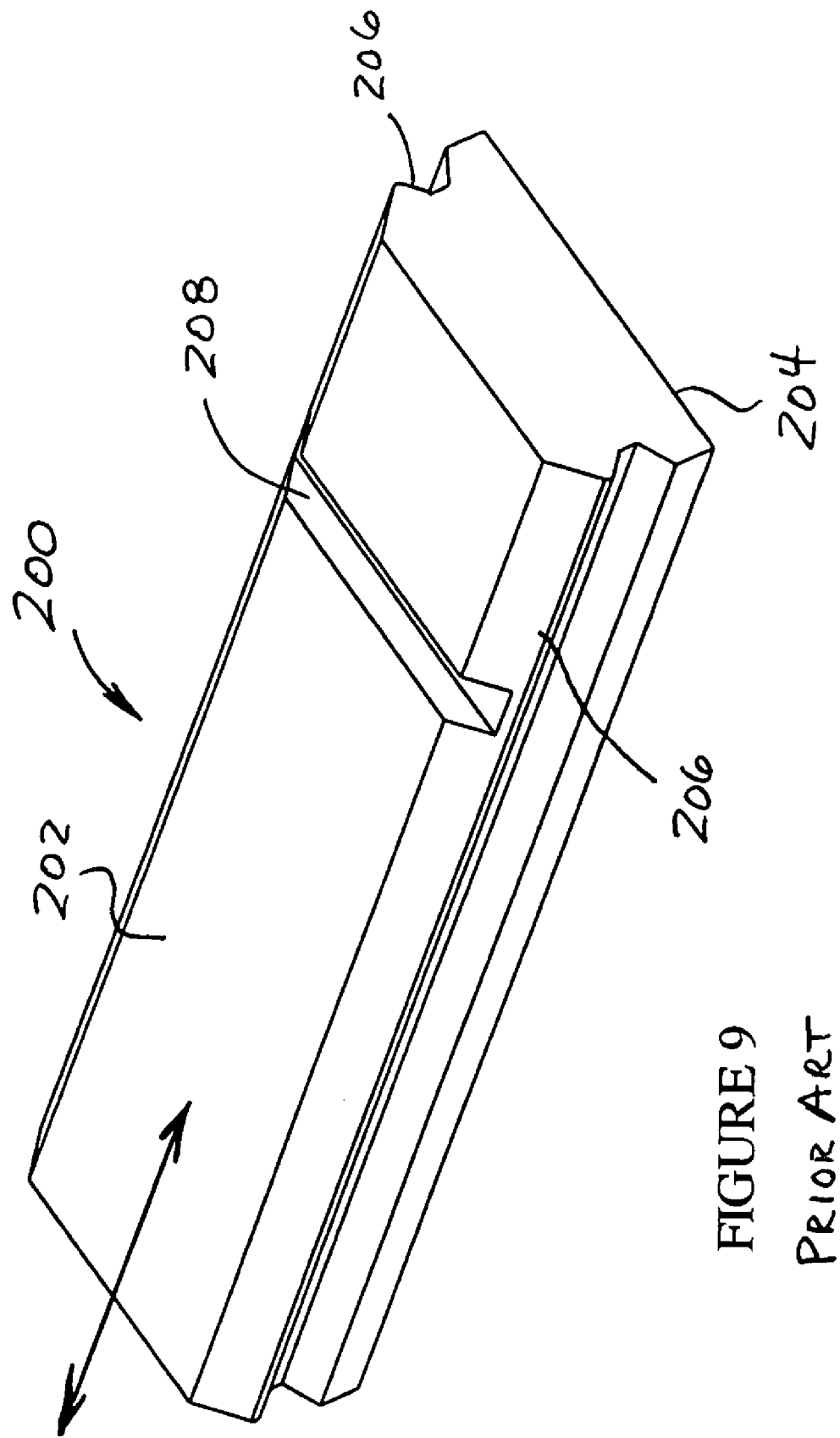
FIG. 9 is an isometric view of an example prior art mounting rail to which the example embodiment of a mountable light of FIGS. 1-5 may be mounted.

FIG. 9 is an isometric view of an example prior art mounting rail 200 to which the example embodiment of a mountable light 10 of FIGS. 1-5 may be mounted. Other mounting rails of different configuration may be provided, and may be of different size and/or shape and/or mounting arrangement, although certain "standard" mounting rails, such as the so-called Piccatinny rail configuration, may have become somewhat of a "standard," although many mounting rails purported to conform to one "standard" or another differ in dimension and/or tolerance from the supposed "standard."

Example mounting rail 200 has a "top" surface 202 that is exposed when rail 200 is mounted to a gun, tool or other object, wherein the "bottom" surface 204 is against the gun, tool or other object. Surfaces 206 define opposing longitudinal sides of mounting rail 200 along which an object mounted thereon, such as a conventional light, may be slid on and off, e.g., in the longitudinal direction indicated by the double-ended arrow, or may be clamped over. The light 10 of the present arrangement can not slide onto rail 200 because keying member 60 thereof will interfere with rail 200 and prevent a sliding on. As a result, light 10 is mounted to rail 200 other than from the end thereof wherein a user's hand might be placed in front of the muzzle of a weapon, and so the keying feature 60 inherently provides a safety feature that leads a user to mount a light 10 from the side of mounting rail 200, e.g., so that keying feature 64 engages slot 208 of mounting rail 200.

Mounting rail 200 has a keying feature 208 to which the object mounted thereon keys or latches as it is slid onto or mounted on rail 200 so as to be held positively in place longitudinally. Keying feature 208 may typically be a slot 208. The object, e.g., a light, if of the slide-on type typically has a button or other release for disengaging from slot 208 for removal of the object from mounting rail 200.

Mounting rails 200 provided on different firearms, e.g., guns of different manufacturers and different types of guns of the same manufacturer, tend to be of different sizes and shapes, as do the rails 204 and keying features 208 thereof. Even mounting rails 200 purporting to conform to a particular standard mounting configuration may have significant dimensional and tolerance differences. In particular, keying features 208 of different mounting rails 200 may be of different size and different shape, and may be located at different locations on mounting rail 200. This results in the need for different lights and/or different mounting devices to mount on different guns and the like, as set forth in the introduction hereof, i.e. the problem addressed by the light described herein.

Figure 10:
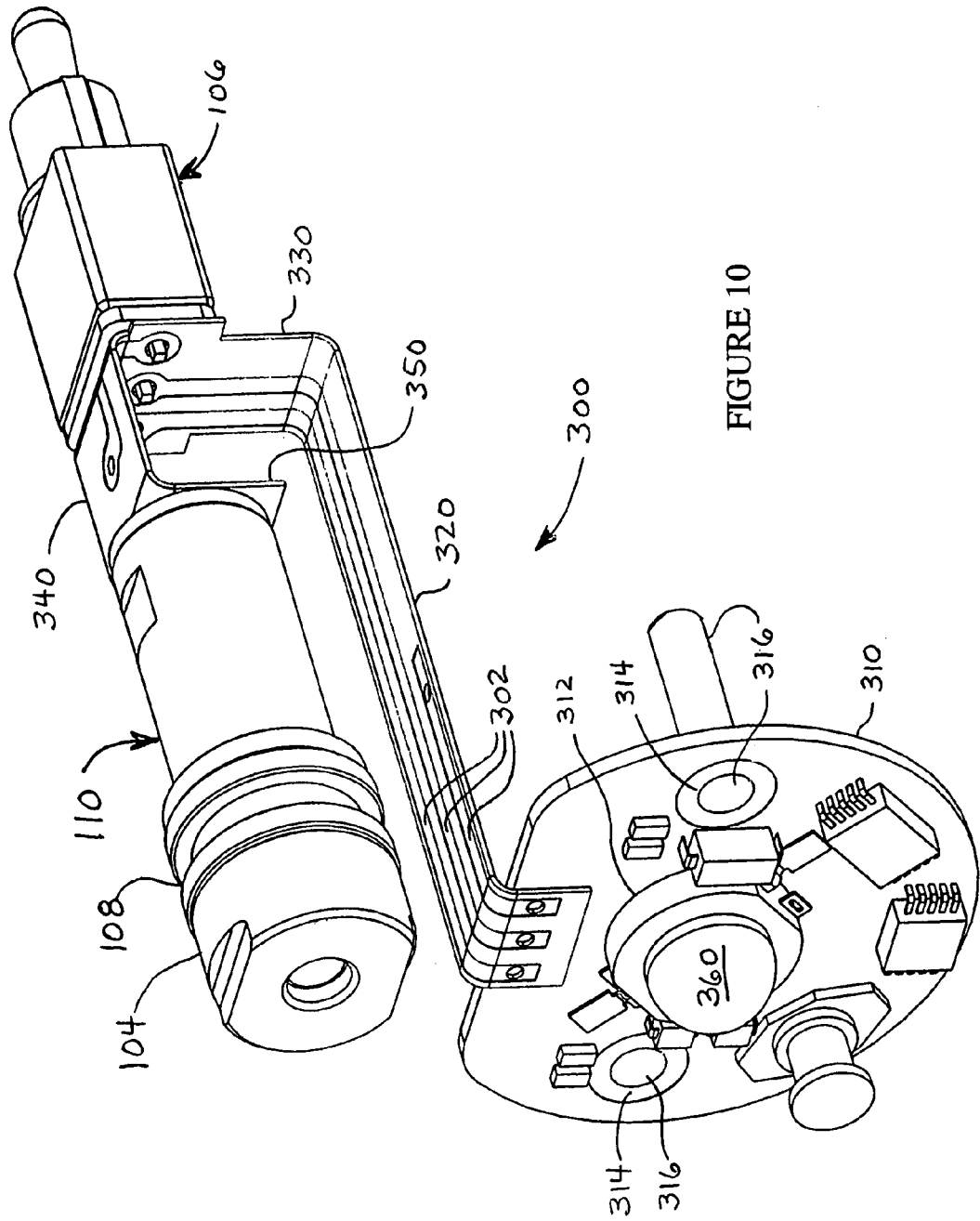
FIG. 10 is an isometric view of an example electrical circuit board arrangement useful in connection with the example embodiment of a mountable light of FIGS. 1-5.

FIG. 10 is an isometric view of an example electrical circuit board arrangement 300 useful with the example embodiment of a mountable light 10 of FIGS. 1-5. Circuit board arrangement 300 includes a shaped portion 310 disposed in a first plane, an elongated portion 320 disposed in a second plane, a third portion 330 disposed in a plane approximately parallel to that of portion 310, a fourth portion 340 in a plane approximately parallel to that of portion 320, and a fifth portion 350 disposed in a plane approximately parallel to that of portion 330. Circuit portions 320 and 340 principally carry various electrical conductors 302 while portions 310, 330 and 350 also support various electrical components and elements provided for the operation of light source 360 and laser 110. Such circuit components and elements are soldered or otherwise connected to circuit structure 300, as is known to those of skill in the art.

Circuit portion 310 has a periphery of predetermined shape, e.g., a "D" shape in the example illustrated, that corresponds to the shape of the mounting surface 48 of light body 40 against which it is disposed, thereby to be disposed in a predetermined position relative to light body 40 and head 20 mounted thereon. Light source 360, e.g., a light-emitting diode (LED), is disposed generally centrally on circuit portion 310 in an opening 312 therethrough, so that the base of LED 360 may bear against or be attached to the mounting surface 48 of light body 40, e.g., for the removal of heat from LED 360. As may be seen in FIG. 8, this arrangement positions LED 360 on mounting surface 48 of light body 40 generally centrally behind reflector 28 so LED 360 extends into reflector 28 through opening 29 therein and is substantially coaxial therewith for providing light that is focused and reflected by reflector 28.

While LED 360 and reflector 28 are generally centrally located in the example illustrated, other locations and other predetermined peripheral shapes may be employed for mounting surface 48 and circuit portion 310. Where LED 360 is a high-power LED, light body 40 is preferably of aluminum or other thermally conductive material, and LED 360 may be coupled to mounting surface 48 with a thermally conductive material, e.g., a thermally conductive grease or a thermally conductive epoxy. Various electrical components relating to operation of LED 360 may be mounted on circuit portion 360 as illustrated.

Circuit portion 310 typically has holes 314 therein for receiving electrical power selectively from batteries 149, responsive to operation of switch 32. Typically, conductive pins or wires or springs 316 extend forward from batteries 149 through openings in light body 40 to extend into holes 314 of circuit portion 310 of circuit structure 300 into which they are electrically and mechanically secured, such as by soldering. Wires or pins 316 may be generally straight, or may be bent, serpentine or looped so as to absorb some of the mechanical energy generated when a firearm to which light 10 is mounted is fired.

Circuit portion 330 has toggle switch 106 connected thereto. Toggle switch may be, e.g., a three-position switch for selecting among various modes of operation of light 10. Among the possible modes are, e.g., only laser 110 operable, only light source 360 operable, and both laser 110 and light source 360 operable. Whether the selected mode is operating or not is controlled by ON/OFF switch 30 described herein. ON/OFF switch 30 may provide, e.g., for continuous operation in the selected mode, for momentary operation in the selected mode, and OFF.

Circuit portion 350 has laser 110, which is typically a laser cartridge 110 including components for providing laser light, connected thereon. As best seen in FIG. 8, laser cartridge 110 has a laser source 112, a laser light tube 114 and a laser lens 116 therein for directing a beam of laser light longitudinally in the same direction as the light from head 20.

Circuit structure 300 may be made in whole or in part of a flexible printed circuit board material, such as a polyimide. Where circuit portion 310 is utilized for properly positioning LED 360, portion 310 is preferably relatively less flexible or even relatively rigid, as may be provided by selection of a type of material therefor, e.g., an FR-4 or a glass epoxy material, or by selection of the thickness of the material, or by providing a stiffening member, typically having the predetermined peripheral shape of circuit portion 310.

Figure 11:
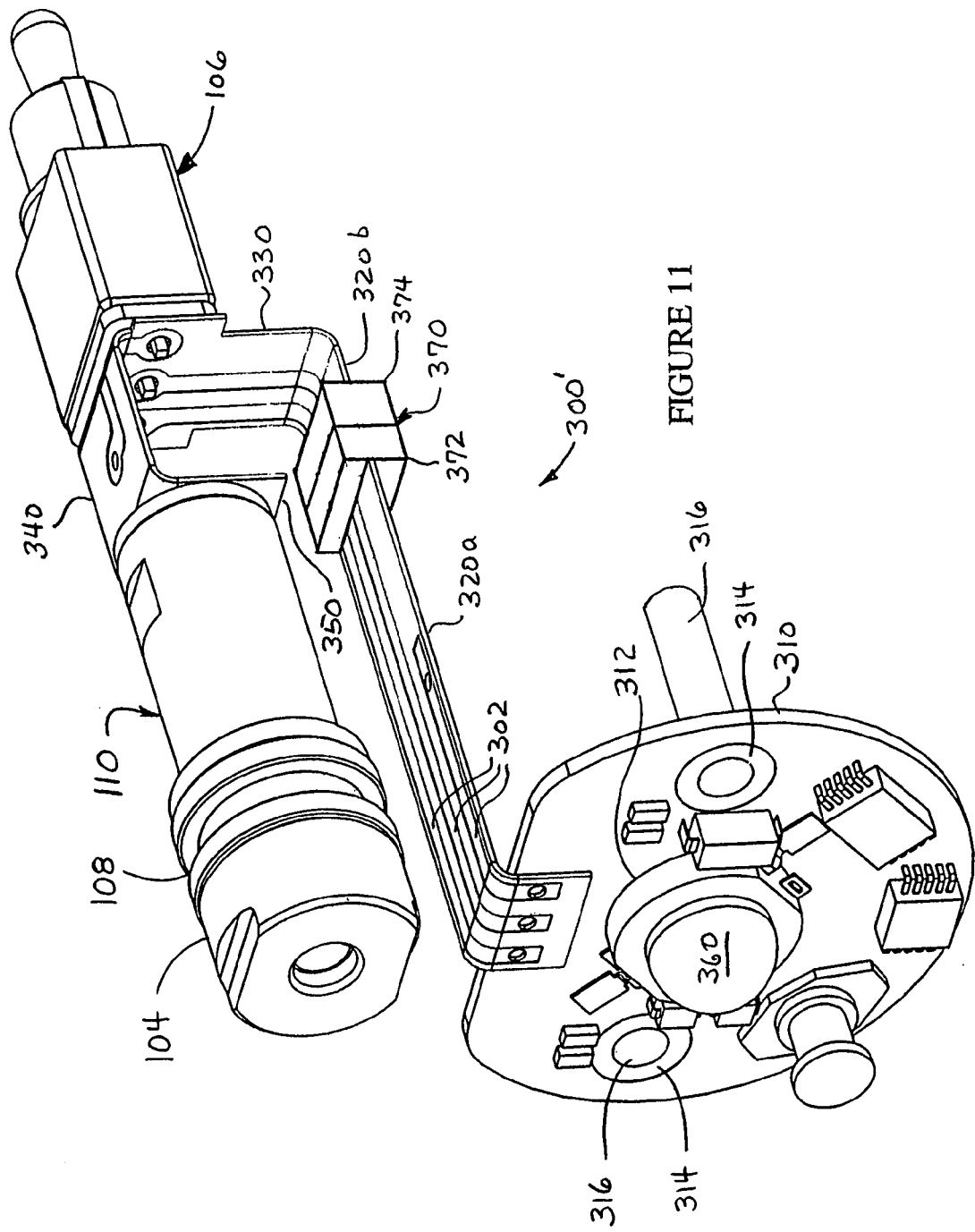
FIG. 11 is an isometric view of an example electrical circuit board arrangement useful with the example embodiment of a mountable light of FIGS. 1-5.

FIG. 11 is an isometric view of an example electrical circuit board arrangement 300' useful with the example embodiment of a mountable light 10 of FIGS. 1-5. Circuit board arrangement 300' differs from arrangement 300 in that a separable electrical connector 370 is employed so that the portions 310, 320a of circuit board arrangement 300' may be separated from the portions 320b, 330, 340, 350 thereof. Separable connector 370 need provide only a few separable electrical connections, e.g., three, which may be provided by pin and socket pairs or by respective contact areas on ones of electrical conductors 302.

Separable connector 370 may be located so that circuit structure 300' is separable at a location along circuit portion 320 as illustrated, or at a location on circuit portion 330, or at a location near the junction of circuit portions 320 and 330, as may be convenient and desirable. As illustrated, separable connector 370 includes two halves, 372 and 374, of which one is a plug and the other is a socket half. Each half may comprise a plastic body having one or more pins and/or sockets therein, wherein halves 372, 374 comprise a conventional electrical connector structure.

For example, circuit portion 320 of circuit structure 300 may be separated into two portions 320a and 320b that overlap for providing separable connector 370, wherein circuit portion 320a is associated with circuit portion 310 in light body 310 and circuit portion 320b is associated with circuit portions 330-350 in laser housing 100. Because portions 320a and 320b overlap, they will overlap when housing 100 is mounted on light body 40 and ones of conductors 302 will come into physical contact when the portions 330-350 of circuit board arrangement 300' that are disposed in laser housing 100 overlap and come into contact with the portions 310-320' that are disposed in light body 40 when laser housing 100 is mounted to light body 40. Thus, the physical contact of respective conductors 302 of circuit portions 320a, 320b cooperate to provide a separable connector 370. Appropriate plating and support can be provided at least in the region of overlap so that the electrical connections between conductors 302 of portions 320a and 320b provided thereby are sufficiently reliable.

An advantage of this arrangement 300' is that the laser housing 100 and its contents may be easily removed from light body 40 and easily mounted thereto by a user, thereby facilitating repair or upgrading from a light 10 that does not include a laser 110 by installing a laser housing 100 including a laser 110 thereon. Where a light 10 does not include a laser 110, a cover in the place and shape of laser housing 100 or in another convenient shape is preferably mounted to light body 40 in place of laser housing 100.

A light 10 mountable on a mounting rail 200 comprises a light body 40 containing a light source 360, a source 149 of electrical energy and a switch 32, 106 for selectively coupling the light source 360 and the source 149 of electrical energy in circuit for producing light. A mounting arrangement 50 on the light body 40 is for mounting the light body 40 on a mounting rail 200 comprises a fixed clamp member 52 on the light body 40, a movable clamp member 54 opposing the fixed clamp member 52 and movable closer to and farther from the fixed clamp member 52, and a clamping device 56, 58 coupling the movable clamp member 54 and the fixed clamp member 52 for biasing the movable clamp member 54 toward the fixed clamp member 52 and for moving the movable clamp member 54 closer to and farther from the fixed clamp member 52, whereby a mounting rail 200 may be clamped between the fixed clamp member 52 and the movable clamp member 54.

A mounting arrangement 50 for mounting an object on a mounting rail 200 comprises a fixed clamp member 52 on the object, a movable clamp member 54 opposing the fixed clamp member 52 and movable closer to and farther from the fixed clamp member 52, a clamping device 56, 58 coupling the movable clamp member 54 and the fixed clamp member 52 for biasing the movable clamp member 54 toward the fixed clamp member 52 and for moving the movable clamp member 54 closer to and farther from the fixed clamp member 54, whereby a mounting rail 200 may be clamped between the fixed clamp member 52 and the movable clamp member 54.

A light 10 mountable on a mounting rail 200 comprises a light body 40 containing a light source 360, a source 149 of electrical energy and a switch 32, for selectively coupling the light source 360 and the source 149 of electrical energy in circuit for producing light. A mounting arrangement 50 on the light body 40 is for mounting the light body 40 on a mounting rail 200 having a keying feature 208. The mounting arrangement 50 comprises first and second clamp members 52, 54 on the light body 40 movable closer together for clamping a mounting rail 200 and farther apart for releasing the mounting rail 200, whereby a mounting rail 200 may be clamped between the first and second clamp members 52, 54. The light body 40 has a recess 42 located on the light body 40 between the first and second clamp members 52, 54 and a keying member 60 removably disposed in the recess 42 of the light body 40, the keying member 60 having a keying feature 64 that engages the keying feature 208 of the mounting rail 200 when the light body 40 is clamped to the mounting rail 200 by the first and second clamping members 52, 54.

A mounting arrangement 50, 60 for mounting an object on a mounting rail 200 having a keying feature 208 comprises first and second clamp members 52, 54 on the object movable closer together for clamping a mounting rail 200 and farther apart for releasing the mounting rail 200, whereby a mounting rail 200 may be clamped between the first and second clamp members 52, 54. The object has a recess 42 located on the object between the first and second clamp members 52, 54, and a keying member 60 removably disposed in the recess 42 of the object, the keying member 60 having a keying feature 64 that engages the keying feature 208 of the mounting rail 200 when the object is clamped to the mounting rail 200 by the first and second clamping members 52, 54.

A light 10 mountable on a mounting rail 200 comprises a light body 40 containing a light source 360, a source 149 of electrical energy and a switch 32 for selectively coupling the light source 360 and the source 149 of electrical energy in circuit for producing light. A mounting arrangement 50, 60 on the light body 40 for mounting the light body 40 on a mounting rail 200 having a keying feature 208 comprises a fixed clamp member 52 on the light body 40, a movable clamp member 54 opposing the fixed clamp member 52 and movable closer to and farther from the fixed clamp member 52, a clamping device 56, 58 coupling the movable clamp member 54 and the fixed clamp member 52 for moving the movable clamp member 54 closer to and farther from the fixed clamp member 52, whereby a mounting rail 200 may be clamped between the fixed clamp member 52 and the movable clamp member 54. The light body 40 has a recess 42 located on the light body 40 between the fixed clamp member 52 and the movable clamp member 54, and a keying member 60 removably disposed in the recess 42 of the light body 40, the keying member 60 having a keying feature 64 that engages the keying feature 208 of the mounting rail 200 when the light body 40 is clamped to the mounting rail 200 by the fixed and movable clamping members 52, 54.

The light 10 is mountable on mounting rails 200 having keying features of different sizes and shapes, and wherein the keying member 60 is selected from a set of keying members 60 for having a keying feature 64 of a size and shape that corresponds to the size and shape of the keying feature 208 of the mounting rail 200.

A light 10 comprises a light body 40 including a mounting surface 48 having a predetermined peripheral shape, a reflector 28 having an opening 29 adapted for receiving a light source 360 disposed proximate the mounting surface 48 of the light body 40. An electrical circuit structure 300, 300' has at least a portion 310 thereof that has a peripheral shape corresponding to the predetermined peripheral shape of the mounting surface 48 that is disposed adjacent the mounting surface 48 between the mounting surface 48 and the reflector 28, wherein the portion 310 of the electrical circuit structure has an opening 312 therethrough opposing the opening 29 of the reflector 28 and adapted for receiving a light source 360. A light source 360 is disposed in the opening 312 of the electrical circuit structure 300, 300' and abutting the mounting surface 48 for producing light in response to electrical energy applied via the electrical circuit structure 300, 300', wherein the light source 360 extends into the opening 29 of the reflector 28 for producing light therein.

In the light 10, the reflector 28 has an optical axis extending through the opening 29 therein, the light source 360 has an optical axis about which light is produced, and the optical axes of the reflector 28 and of the light source 360 are substantially coaxial when the light source 360 is disposed in the opening 312 of the circuit structure 300, 300' abutting the mounting surface 48 and extending into the opening 29 of the reflector 28.

An electrical circuit structure 300, 300' for a light 10 comprises at least first and second substantially planar circuit portions 310-350 disposed in different planes and having electrical conductors 302 thereon. The first planar circuit portion 310 has a peripheral shape corresponding to the shape of a planar mounting surface 48 adjacent to which it is adapted to be mounted, and has an opening 312 therein in a predetermined location relative to the peripheral shape thereof, wherein the opening 312 is adapted for receiving a light source 360. A light source 360 is mounted in the opening 312 of the first planar circuit portion 310 for receiving electrical energy from the electrical conductors 316, and a switch 32, 106 is mounted to the second planar circuit portion 310, 330 for selectively applying electrical energy to at least one of the electrical conductors 302 thereon for selectively energizing the light source 360.

The electrical circuit structure 300, 300' further comprises at least a third substantially planar circuit portion 350 disposed in a third different plane and having electrical conductors 302 thereon, and a laser light source 110 mounted to the third planar circuit portion 350, wherein the switch 106 is mounted to the second planar circuit portion 330 is for selectively applying electrical energy to at least one of the electrical conductors 302 thereon for selectively energizing the laser light source 110.

The electrical circuit structure 300, 300' further comprises a separable electrical connector 370, 372, 374 interposed between the first and second portions 310, 320, 320a, 320b 330 for providing separable electrical connections therebetween.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such.

A light mountable on an object may comprise: a light body for supporting an illumination light source and having a cavity for receiving one or more batteries therein; a mounting arrangement on the light body for mounting the light on an object; an illumination light source disposed in the light body for selectively providing illumination in given direction; a cover attached to the light body for receiving an optional aiming light source therein for optionally providing aiming light in the given direction; an electrical switch for selectively actuating the light source, the optional aiming light source, or both; and an electrical circuit structure disposed in the light body and having terminals for receiving electrical potential from a battery when the one or more batteries are provided in the cavity of the light body, wherein the electrical circuit structure provides electrical connections among the illumination light source, the optional aiming light source, the electrical switch, and the terminals, wherein the electrical switch selectively connects the illumination light source to the terminals via the electrical circuit structure and selectively connects the optional illumination source to the terminals via the electrical circuit structure. The illumination light source may be a light-emitting diode, or the optional aiming light source may be a laser light source, or the illumination light source may be a light-emitting diode and the optional aiming light source may be a laser light source. The electrical circuit structure may comprise first and second planar connected circuit portions, wherein the first planar circuit portion may be disposed in the light body for connecting to the illumination light source and wherein the second planar circuit portion may be disposed for connecting to the electrical switch. The electrical circuit structure may further comprise: at least a third substantially planar circuit portion disposed in a third different plane and having electrical conductors thereon connected to the first and second planar circuit portions, wherein the third planar circuit portion is for connecting to the optional aiming light source, and wherein the electrical switch connected to the second planar circuit portion is for selectively applying electrical energy to at least one of the electrical conductors thereon for selectively energizing the optional aiming light source. A separable electrical connector may be interposed between the first and second planar circuit portions or between the first and third planar circuit portions for providing separable electrical connections therebetween. The electrical circuit structure may comprise: at least first and second substantially planar circuit portions disposed in two different planes and having electrical conductors thereon, the first planar circuit portion having a peripheral shape corresponding to a shape of a planar mounting surface of the light body adjacent to which it may be mounted, the first planar circuit portion having an opening therein in a predetermined location relative to the peripheral shape thereof, wherein the opening is for receiving the illumination light source; wherein the illumination light source may be in the opening of the first planar circuit portion for receiving electrical energy from the electrical conductors; and wherein the electrical switch may be connected to the second planar circuit portion for selectively applying electrical energy to at least one of the electrical conductors thereon for selectively energizing the illumination light source. The peripheral shape of the first planar circuit portion may cooperate with the corresponding shape of the planar mounting surface of the light body adjacent to which it may be mounted for positioning the illumination light source for providing light in a given direction. The electrical circuit structure may further comprise: at least a third substantially planar circuit portion disposed in a third different plane and having electrical conductors thereon, wherein the third planar circuit portion is for connecting to the optional aiming light source, and wherein the electrical switch connected to the second planar circuit portion is for selectively applying electrical energy to at least one of the electrical conductors thereon for selectively energizing the optional aiming light source. A separable electrical connector may be interposed between the first and second planar circuit portions or between the first and third planar circuit portions for providing separable electrical connections therebetween. A second electrical switch may be provided for selectively connecting the one or more batteries with the terminals of the electrical circuit structure when the one or more batteries are provided in the cavity of the light body.

An electrical circuit structure for a light may comprise: at least first and second substantially planar circuit portions disposed in two different planes and having electrical conductors thereon, the first planar circuit portion having a peripheral shape corresponding to the shape of a planar mounting surface adjacent to which it is adapted to be mounted, the first planar circuit portion having an opening therein in a predetermined location relative to the peripheral shape thereof, wherein the opening is for receiving a light source; a light source mounted in the opening of the first planar circuit portion for receiving electrical energy from the electrical conductors; and a switch mounted to the second planar circuit portion for selectively applying electrical energy to at least one of the electrical conductors thereon for selectively energizing the light source. The peripheral shape of the first planar circuit portion may cooperate with the corresponding shape of the planar mounting surface for positioning the light source for providing light in a given direction. The electrical circuit structure may further comprise: at least a third substantially planar circuit portion disposed in a third different plane and having electrical conductors thereon, and a laser light source mounted to the third planar circuit portion, wherein the switch mounted to the second planar circuit portion is for selectively applying electrical energy to at least one of the electrical conductors thereon for selectively energizing the laser light source. A separable electrical connector may be interposed between the first and third planar circuit portions for providing separable electrical connections therebetween, or between the first and second planar circuit portions for providing separable electrical connections therebetween.

A light may comprise: a light body for supporting an illumination light source and having a cavity for receiving a battery therein; a first light source disposed in the light body for selectively providing illumination in a given direction; a cover attached to the light body for receiving an optional second light source therein for optionally providing light in the given direction; a switch for selectively energizing the first light source, the optional second light source, or both; and a circuit structure in the light body and having terminals for receiving electrical potential, wherein the circuit structure provides electrical connections among the first light source, the optional second light source, the switch, and the terminals, wherein the switch selectively connects the first light source to the terminals via the electrical circuit and selectively connects the optional second light source to the terminals via the circuit structure. The first light source may be a light-emitting diode, or the optional second light source may be a laser aiming light, or wherein the first light source may be a light-emitting diode and the optional second light source may be a laser aiming light. The circuit structure may comprise first and second connected circuit portions, wherein the first circuit portion is for connecting to the first light source and wherein the second circuit portion is for connecting to the switch. A separable electrical connector may be provided between the first and second circuit portions. The circuit structure may further comprise: at least a third circuit portion having electrical conductors thereon connected to the first and second circuit portions, wherein the third circuit portion is for connecting to the optional second light source, and wherein the switch connected to the second circuit portion is for selectively energizing the optional second light source. A separable electrical connector may be interposed between the first and second circuit portions or between the first and third circuit portions for providing separable electrical connections therebetween. The circuit structure may comprise: at least first and second circuit portions having electrical conductors thereon, the first circuit portion having a peripheral shape corresponding to a shape of a mounting surface adjacent to which it is to be mounted, the first circuit portion having an opening therein in a predetermined location relative to the peripheral shape thereof, wherein the first light source is in the opening of the first circuit portion for receiving electrical energy from the electrical conductors; and wherein the switch is connected to the second circuit portion for selectively energizing the first light source. The circuit structure may further comprise: at least a third circuit portion having electrical conductors thereon, wherein the optional second light source connects to the third circuit portion, and wherein the switch mounted to the second circuit portion is for selectively energizing the optional second light source. A separable connector may be provided between the first and second circuit portions or between the first and third circuit portions.

A light may comprise: a light body for supporting an illumination light source and having a cavity for receiving a battery therein; a first light source disposed in the light body for selectively providing illumination in a given direction; a cover attached to the light body for receiving an optional second light source therein for optionally providing light in the given direction; a switch for selectively energizing the first light source, the optional second light source, or both; and a circuit structure in the light body and having terminals for receiving electrical potential, the circuit structure including first, second and third connected circuit portions, wherein the first circuit portion is for connecting to the first light source, wherein the second circuit portion is for connecting to the switch, wherein the third circuit portion is for connecting to the optional second light source, and wherein the circuit structure provides electrical connections among the first light source, the optional second light source, the switch, and the terminals, wherein the switch selectively connects the first light source, the optional second light source, or both, to the terminals via the circuit structure. The first light source may be for providing illuminating light and the optional second light source may be for optionally providing aiming light. The first light source may provide the illuminating light in a given direction and the optional second light source may optionally provide the aiming light in the same direction. The first light source may be a light-emitting diode, or the optional second light source may be a laser aiming light, or the first light source may be a light-emitting diode and the optional second light source may be a laser aiming light. A separable connector may be interposed between the first and second circuit portions or between the first and third circuit portions.

A light may comprise: a light body for supporting an illumination light source and having a cavity for receiving a battery therein; a first light source disposed in the light body for selectively providing illumination in a given direction; a cover attached to the light body for receiving an optional second light source therein for optionally providing light in the given direction; a switch for selectively energizing the first light source, the optional second light source, or both; and a circuit structure in the light body and having terminals for receiving electrical potential, the circuit structure including at least first and second connected circuit portions, wherein the first circuit portion is for connecting to the first light source, wherein the second circuit portion is for connecting to the optional second light source, and wherein the circuit structure provides electrical connections among the first light source, the optional second light source, the switch, and the terminals, a separable connector interposed between the first and second circuit portions, whereby the optional second light source is removable; wherein the switch selectively connects the first light source, the optional second light source, or both, to the terminals via the circuit structure. The first light source may be for providing illuminating light and the optional second light source may be for optionally providing aiming light. The first light source may be a light emitting diode for providing illuminating light and the optional second light source may be a laser aiming light for optionally providing aiming light.

While the present invention has been described in terms of the foregoing example embodiments, variations within the scope and spirit of the present invention as defined by the claims following will be apparent to those skilled in the art. For example, while the clamping device is described in the examples herein as a clamp screw 56, other clamping devices may be employed. One example is a lever having an offset lobe that pulls a rod attached to movable clamp member 54 through hole 44 tight as the lobed lever is engaged, and such lever may or may not threadingly engage a hole in movable member 54. In addition, biasing spring 58 need not be a wave spring, but may be, e.g., a helical or other spring providing suitable bias, if desired.

Although keying members having a projecting keying feature are described for engaging mounting rails having a recessed keying feature, the keying member may have a recessed keying feature corresponding to a projecting keying feature of a mounting rail, or the keying member may have both recessed and projecting keying features corresponding to projecting and recessed keying features of a mounting rail. Similarly, keying member 62 may have a recess that fits onto a projection from light body 40 in place of the recess 42 in light body 40 that receives the body 63 of key member 62.

Where a separate keying member 62 is not employed, clamping device 56 may be located in a position wherein it traverses the cavity 41 defined by fixed clamping member 52 and movable clamping member 54 for receiving a mounting rail, so that the shank or shaft of clamping device 56 may serve as a keying feature for engaging a transverse slot in a mounting rail.

Further, circuit structure 300, 300' may be a unitary circuit board or may be an assembly of two or more circuit boards, as may be convenient in a particular instance. In such cases, circuit portion 310 may be of a relatively rigid circuit board material and circuit portions 320-350 may be of a relatively flexible circuit board material. Alternatively, circuit structure 300, 300' may be an assembly of circuit boards and electrical ribbon cable.

Where circuit board 300 is a unitary circuit board made of a flexible or bendable electronic substrate material, circuit portion 310 thereof may be bonded to a rigid spacer that is, e.g., of the predetermined peripheral shape for positioning portion 310 relative to mounting surface 48 and reflector 28.

Optionally, an insulating spacer, e.g. insulator 308, may be interposed between one or more portions of circuit board 300, 300' and light body 40, e.g., between circuit portion 310 and mounting surface 48 as shown in FIG. 8, for electrically insulating the conductors on circuit structure 300, 300' from body 40 which may be of aluminum or other electrically conductive material, but which may be of nylon or plastic or other insulating material. Typically, insulator 308 is of the same general shape as circuit board portion 310 and mounting surface 48, e.g., a "D" shape.

While the light and mount arrangement described herein is described in the context of a gun and a gun-mountable light, it is contemplated that the described mounting arrangement may also be utilized for mounting objects other than a light and/or for mounting objects other than to a gun or other firearm. As used herein, a gun may refer to any firearm, such as a handgun or pistol, a long gun or rifle, a shotgun, or another type of gun or weapon. In addition, the light and mounting arrangement described herein may be disposed on the top side of a weapon or other implement, or on the bottom thereof, or an either side thereof.

The term "light" is contemplated to encompass any device that produces or otherwise provides illumination of any type and from any source, whether a conventional incandescent or other lamp, a specialized lamp, a laser source, or a solid state light source such as an LED or a laser diode, irrespective of whether the power source includes one or more batteries within or without the light or a wire or cable connection to a fixed or portable power source wherever located.

Various screws herein, such as key screw 68, housing screws 102, aiming set screws 122, 124, are typically Allen head or Torx head screws, but may be Phillips head, flat-blade head or other types of screws, as desired. However, clamping screw 56 is preferably of a type that can be turned using one's fingers or a coin or some other readily available item without the need for a tool, although a tool may be used if desired. Clamping screw 56, key screw 68, or both, may be a screw, bolt, pin or other suitable fastener.

Further, cover 30 including switch 32 may be replaced by a cover and a remotely operable switch connected by wire or cable, as may be desirable for utilizing light 10 on a long gun, rifle or shotgun wherein light 10 is mounted to a mounting rail 200 proximal the muzzle end thereof and wherein the switch is disposed proximal the trigger or other operator hand position. Further, mounting rail 200 may be of any suitable arrangement, and may be provided by a weapon provider or by a third party for attachment to a weapon or implement and/or those provided as part of a weapon or implement, either as an integral part thereof or as an attachment thereto, as the case may be.

U.S. Provisional Patent Application No. 60/627,860 filed Nov. 15, 2004, entitled LIGHT MOUNTABLE ON A MOUNTING RAIL, and U.S. patent application Ser. No. 11/268,787 filed Nov. 8, 2005, entitled LIGHT MOUNTABLE ON A MOUNTING RAIL, are hereby incorporated herein by reference in their entirety.

What is claimed is:

1. A light mountable on a mounting rail of an object comprising:
   a light body having a mounting surface for an illumination light source and having a cavity for receiving one or more batteries therein;
   a mounting arrangement on said light body wherein said light is mountable on the mounting rail of the object;
   an illumination light source disposed in said light body for selectively providing illumination in a given direction, wherein said illumination light source includes a light emitting diode having a base disposed against the mounting surface of said light body to remove heat from said illumination light source to said light body;
   a housing removably attached to a side of said light body, said housing defining a cavity between said housing and the side of said light body, wherein an aiming light source is removably mountable therein to provide aiming light in the given direction;
   a connector removably attaching said housing to the side of said light body;
   an electrical switch for selectively actuating said light source, the removable aiming light source, or both; and
   an electrical circuit structure disposed in said light body and having terminals for receiving electrical potential from a battery when the one or more batteries are provided in the cavity of said light body, wherein said electrical circuit structure provides electrical connections among said illumination light source, the removable aiming light source, said electrical switch, and the terminals,
   wherein said electrical switch selectively connects said illumination light source to the terminals via said electrical circuit structure and selectively connects removable aiming source to the terminals via said electrical circuit structure.

2. The light of claim 1 wherein the removable aiming light source is a laser light source.

3. The light of claim 1 wherein said electrical circuit structure comprises first and second planar connected circuit portions, wherein the first planar circuit portion is disposed in said light body for connecting to said illumination light source and wherein said second planar circuit portion is disposed for connecting to said electrical switch.

4. The light of claim 3 wherein said electrical circuit structure further comprises:
   at least a third substantially planar circuit portion disposed in a plane different from the planes in which the first and second substantially planar circuit portions are disposed, said third substantially planar circuit portion having electrical conductors thereon connected to said first and second planar circuit portions,
   wherein the third planar circuit portion is for connecting to the removable aiming light source, and
   wherein said electrical switch connected to the second planar circuit portion is for selectively applying electrical energy to at least one of the electrical conductors thereon for selectively energizing the removable aiming light source.

5. The light of claim 4 further comprising a separable electrical connector interposed between the first and second planar circuit portions or between the first and third planar circuit portions for providing separable electrical connections therebetween.

6. The light of claim 1 wherein said electrical circuit structure comprises:
   at least first and second substantially planar circuit portions disposed in two different planes and having electrical conductors thereon,
   the first planar circuit portion having a peripheral shape corresponding to a shape of the mounting surface of said light body adjacent to which it is to be mounted, the first planar circuit portion having an opening therein in a predetermined location relative to the peripheral shape thereof, wherein the opening is for receiving said illumination light source;

wherein said illumination light source is in the opening of the first planar circuit portion for receiving electrical energy from the electrical conductors; and wherein said electrical switch is connected to the second planar circuit portion for selectively applying electrical energy to at least one of the electrical conductors thereon for selectively energizing said illumination light source.

7. The light of claim 6 wherein the peripheral shape of the first planar circuit portion cooperates with the corresponding shape of the mounting surface of said light body adjacent to which it is to be mounted for positioning said illumination light source for providing light in a given direction.

8. The light of claim 6 wherein said electrical circuit structure further comprises:
at least a third substantially planar circuit portion disposed in a third different plane and having electrical conductors thereon,
wherein the third planar circuit portion is for connecting to the removable aiming light source, and
wherein said electrical switch connected to the second planar circuit portion is for selectively applying electrical energy to at least one of the electrical conductors thereon for selectively energizing the removable aiming light source.

9. The light of claim 8 further comprising a separable electrical connector interposed between the first and second planar circuit portions or between the first and third planar circuit portions for providing separable electrical connections therebetween.

10. The light of claim 1 further comprising a second electrical switch for selectively connecting the one or more batteries with the terminals of said electrical circuit structure when the one or more batteries are provided in the cavity of said light body.

11. A light comprising:
a light body having a mounting surface for an illumination light source and having a cavity for receiving a battery therein;
a first light source disposed in said light body for selectively providing illumination in a given direction, wherein said illumination light source includes a light emitting diode having a base disposed against the mounting surface of said light body to remove heat from said illumination light source to said light body;
a housing removably attached to said light body, said housing defining a cavity between said housing and said light body, wherein a second light source is removably mountable therein to provide light in the given direction;
a switch for selectively energizing said first light source, the removable second light source, or both; and
a circuit structure in said light body and having terminals for receiving electrical potential, wherein said circuit structure provides electrical connections among said first light source, the removable second light source, said switch, and the terminals,
wherein said switch selectively connects said first light source to the terminals via said circuit structure and selectively connects the removable second light source to the terminals via said circuit structure.

12. The light of claim 11 wherein the removable second light source is a laser aiming light.

13. The light of claim 11 wherein said circuit structure comprises first and second connected circuit portions, wherein the first circuit portion is for connecting to said first light source and wherein said second circuit portion is for connecting to said switch.

14. The light of claim 13 further comprising a separable electrical connector between the first and second circuit portions.

15. The light of claim 13 wherein said circuit structure further comprises:
at least a third circuit portion having electrical conductors thereon connected to said first and second circuit portions,
wherein the third circuit portion is for connecting to the removable second light source, and
wherein said switch connected to the second circuit portion is for selectively energizing the removable second light source.

16. The light of claim 15 further comprising a separable electrical connector interposed between the first and second circuit portions or between the first and third circuit portions for providing separable electrical connections therebetween.

17. The light of claim 11 wherein said circuit structure comprises:
at least first and second circuit portions having electrical conductors thereon,
the first circuit portion having a peripheral shape corresponding to a shape of the mounting surface adjacent to which it is to be mounted, the first circuit portion having an opening therein in a predetermined location relative to the peripheral shape thereof,
wherein said first light source is in the opening of the first circuit portion for receiving electrical energy from the electrical conductors; and
wherein said switch is connected to the second circuit portion for selectively energizing said first light source.

18. The light of claim 17 wherein said circuit structure further comprises:
at least a third circuit portion having electrical conductors thereon,
wherein the removable second light source connects to the third circuit portion, and
wherein said switch mounted to the second circuit portion is for selectively energizing the removable second light source.

19. The light of claim 18 further comprising a separable connector between the first and second circuit portions or between the first and third circuit portions.

20. A light comprising:
a light body having a mounting surface for an illumination light source and having a cavity for receiving a battery therein;
a first light source disposed in said light body for selectively providing illumination in a given direction, wherein said first light source includes a light emitting diode having a base disposed against the mounting surface of said light body to remove heat from said first light source to said light body;
a housing removably attached to said light body, said housing defining a space between said housing and said light body, wherein a second light source is removably mountable therein to provide light in the given direction;
a switch for selectively energizing said first light source, the removable second light source, or both; and
a circuit structure in said light body and having terminals for receiving electrical potential, said circuit structure including first, second and third connected circuit portions, wherein the first circuit portion is for connecting to said first light source, wherein the second circuit portion is for connecting to said switch, wherein the third circuit portion is for connecting to the removable second light source, and wherein said circuit structure provides electrical connections among said first light source, the removable second light source, said switch, and the terminals, wherein said switch selectively connects said first light source, the removable second light source, or both, to the terminals via said circuit structure.

21. The light of claim 20 wherein said first light source is for providing illuminating light and wherein the removable second light source is for optionally providing aiming light.

22. The light of claim 21 wherein said first light source provides the illuminating light in a given direction and wherein the removable second light source optionally provides the aiming light in the same direction.

23. The light of claim 20 wherein the removable second light source is a laser aiming light.

24. The light of claim 20 further comprising a separable connector interposed between the first and second circuit portions or between the first and third circuit portions.

25. A light comprising:
a light body having a mounting surface for an illumination light source and having a cavity for receiving a battery therein;
a first light source disposed in said light body for selectively providing illumination in a given direction, wherein said first light source includes a light emitting diode having a base disposed against the mounting surface of said light body to remove heat from said first light source to said light body;
a housing removably attached to said light body, said housing defining a space between said light body and said housing, wherein a second light source is removably mountable therein to provide light in the given direction;
a switch for selectively energizing said first light source, the removable second light source, or both; and
a circuit structure in said light body and having terminals for receiving electrical potential, said circuit structure including at least first and second connected circuit portions, wherein the first circuit portion is for connecting to said first light source, wherein the second circuit portion is for connecting to the removable second light source, and wherein said circuit structure provides electrical connections among said first light source, the removable second light source, said switch, and the terminals,
a separable connector interposed between the first and second circuit portions, whereby the removable second light source is removable;
wherein said switch selectively connects said first light source, the removable second light source, or both, to the terminals via said circuit structure.

26. The light of claim 25 wherein said first light source is for providing illuminating light and wherein the removable second light source is for providing aiming light.

27. The light of claim 25 wherein the removable second light source is a laser aiming light for providing aiming light.

28. A light comprising:
a light body having a mounting surface for a light source and having a cavity for receiving a battery therein;
a first light source disposed in said light body for selectively providing illumination, wherein said first light source includes a light emitting diode having a base disposed against the mounting surface of said light body to remove heat from said first light source to said light body;
a housing removably attached to said light body, said housing defining a cavity between said light body and said housing, wherein a second light source is removably mountable therein;
a second light source in the cavity defined by said housing for providing light;
a switch for selectively energizing said first light source, said second light source, or both; and
an electrical circuit structure in said light body and having terminals for receiving electrical potential when a battery is in the cavity of said light body, wherein said electrical circuit structure provides electrical connections among said first light source, said second light source, said switch, and the terminals,
wherein said switch selectively connects said first light source to the terminals via said electrical circuit structure and selectively connects said second light source to the terminals via said electrical circuit structure.

29. The light of claim 28 wherein at least one of said first light source and said second light source includes a light-emitting diode.

30. The light of claim 28 wherein said second light source is a laser aiming light.

31. The light of claim 28 wherein said electrical circuit structure comprises first and second connected circuit portions, wherein the first circuit portion is for connecting to said first light source and wherein said second circuit portion is for connecting to said switch.

32. The light of claim 31 further comprising a separable electrical connector between the first and second circuit portions.

33. The light of claim 31 wherein said electrical circuit structure further comprises:
at least a third circuit portion having electrical conductors thereon connected to said first and second circuit portions,
wherein the third circuit portion is for connecting to said second light source, and
wherein said switch connected to the second circuit portion is for selectively energizing said second light source.

34. The light of claim 28 wherein said electrical circuit structure comprises:
at least first and second circuit portions having electrical conductors thereon,
the first circuit portion having a peripheral shape corresponding to a shape of the mounting surface adjacent to which it is to be mounted, the first circuit portion having an opening therein in a predetermined location relative to the peripheral shape thereof,
wherein said first light source is in the opening of the first circuit portion for receiving electrical energy from the electrical conductors; and
wherein said switch is connected to the second circuit portion for selectively energizing said first light source.

35. The light of claim 28 wherein said electrical circuit structure includes a first circuit portion disposed adjacent the mounting surface of said light body and connecting to said first light source, said first circuit portion having a peripheral shape that cooperates with a corresponding shape of the mounting surface adjacent to which it is disposed for positioning the light emitting diode of said first light source for providing light in a given direction.

* * * * *